(12) United States Patent
Oda

(10) Patent No.: US 8,593,192 B2
(45) Date of Patent: Nov. 26, 2013

(54) SEMICONDUCTOR DEVICE AND METHOD FOR CONTROLLING FLIP-FLOP

(75) Inventor: Yasuhiro Oda, Kanagawa (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 0 days.

(21) Appl. No.: 13/612,626

(22) Filed: Sep. 12, 2012

(65) Prior Publication Data
US 2013/0002328 A1    Jan. 3, 2013

Related U.S. Application Data

(62) Division of application No. 13/064,351, filed on Mar. 21, 2011, now Pat. No. 8,493,106.

(30) Foreign Application Priority Data

Mar. 25, 2010   (JP) ................................. 2010-070006

(51) Int. Cl.
*H03K 3/02*   (2006.01)
*H03K 17/00*   (2006.01)

(52) U.S. Cl.
USPC .............. 327/198; 327/212; 327/225; 326/93

(58) Field of Classification Search
USPC ......... 327/141–143, 198–203, 208–214, 218, 327/223–225; 326/93–98
See application file for complete search history.

(56) References Cited

U.S. PATENT DOCUMENTS

| 6,870,412 | B2* | 3/2005 | Cho ............................. 327/202 |
| 7,583,121 | B2* | 9/2009 | Berzins et al. ................ 327/202 |
| 7,622,955 | B2* | 11/2009 | Vilangudipitchai et al. ..... 326/68 |
| 7,652,513 | B2* | 1/2010 | Rao et al. ...................... 327/203 |
| 8,493,106 | B2* | 7/2013 | Oda .............................. 327/141 |
| 2008/0028343 | A1 | 1/2008 | Sato et al. |
| 2008/0218233 | A1 | 9/2008 | Yamamoto et al. |
| 2009/0066386 | A1 | 3/2009 | Lee |
| 2010/0023898 | A1 | 1/2010 | Nomura et al. |
| 2010/0308876 | A1* | 12/2010 | Kawasaki et al. ............ 327/143 |
| 2011/0121876 | A1 | 5/2011 | Frederick, Jr. |

FOREIGN PATENT DOCUMENTS

| JP | 8-191234 A | 7/1996 |
| JP | 2008-219491 A | 9/2008 |

OTHER PUBLICATIONS

US Notice of Allowance and Fee(s) Due dated Mar. 22, 2013 for co-pending U.S. Appl. No. 13/064,351.
U.S. Office Action dated Dec. 7, 2012 for U.S. Appl. No. 13/064,351.

* cited by examiner

*Primary Examiner* — Patrick O'Neill
(74) *Attorney, Agent, or Firm* — McGinn IP Law Group, PLLC

(57) ABSTRACT

A semiconductor integrated circuit includes a first retention flip-flop configured in a first type in which a retention flip-flop is able to retain data based on one of a low-level clock signal and a high-level clock signal, and unable to retain data based on another one of the low-level clock signal and high-level clock signal, and a second retention flip-flop configured in a second type in which a retention flip-flop is able to retain data based on the low-level clock signal and also able to retain data based on the high-level clock signal.

5 Claims, 16 Drawing Sheets

| CLKIN | EN1 | CLK_STOP | Q | RFF1_CLK_IN |
|---|---|---|---|---|
| 0 | 0 | 0 | 0 | 0 |
| 1 | 0 | 0 | Q | Q |
| 0 | 1 | 0 | 1 | 0 |
| 1 | 1 | 0 | Q | Q |
| X | X | 1 | 0 | 0 |

* WHEN CLKIN=1, DATA Q INDICATES PREVIOUS-STATE VALUE

| CLKIN | EN2 | CLK_STOP | Q | RFF2_CLK_IN |
|---|---|---|---|---|
| 0 | 0 | 0 | Q | Q |
| 1 | 0 | 0 | 1 | 1 |
| 0 | 1 | 0 | Q | Q |
| 1 | 1 | 0 | 0 | 1 |
| X | X | 1 | 1 | 1 |

* WHEN CLKIN=1, DATA Q INDICATES PREVIOUS-STATE VAL

PRIOR ART

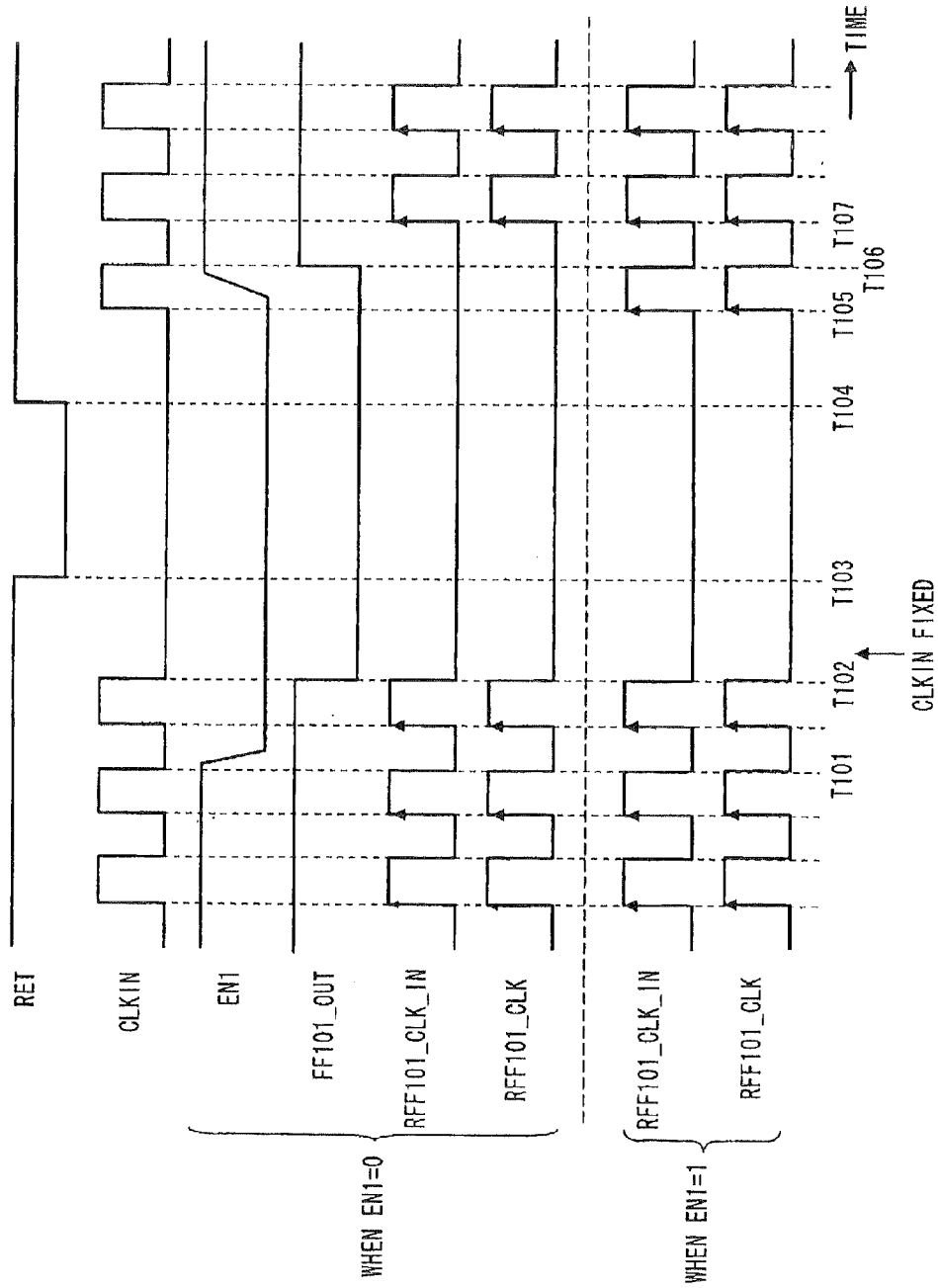

SEMICONDUCTOR DEVICE AND METHOD FOR CONTROLLING FLIP-FLOP

CROSS-REFERENCE TO RELATED APPLICATIONS

The present application is a Divisional Application of U.S. patent application Ser. No. 13/064,351, filed on Mar. 21, 2011, now U.S. Pat. No. 8,493,106 which is based on and claims priority from Japanese patent application No. 2010-070006, filed on Mar. 25, 2010, the entire contents of which is incorporated herein by reference.

BACKGROUND

The present invention relates to a semiconductor device and a method for controlling a flip-flop, and more particularly, to a semiconductor device including a flip-flop having a retention function, and a method for controlling a flip-flop.

As a technique for reducing power consumption in semiconductor devices, there is a technique of interrupting power supply to arithmetic and logic unit cells that are not operating. This technique can be implemented so that an operation similar to that before the power supply is interrupted can be performed when the power supply is resumed, by using a flip-flop having a retention function for storing data also when the power supply is interrupted.

FIG. 15 is a circuit diagram illustrating a semiconductor device according to a related art. The semiconductor device shown in FIG. 15 includes clock gating circuits 101 and 102 and master-slave flip-flops RFF101 and RFF102 having a retention function. The clock gating circuit 101 includes a flip-flop FF101 and an AND circuit AND101. The flip-flop FF101 is driven by a negative edge of a clock signal CLKIN, and outputs an enable signal EN1 at the timing of the negative edge. The AND101 receives an output (FF101_OUT) of the flip-flop FF101 and the clock signal CLKIN, and outputs a result of a logical AND operation between the output of the flip-flop FF101 and the clock signal CLKIN.

The flip-flop RFF101 is a master-slave flip-flop capable of retaining data when an output (RFF101_CLK_IN) of the AND101 is at a low level. FIG. 16A is a diagram illustrating the flip-flop RFF101 (see Japanese Unexamined Patent Application Publication No. 2008-219491). As shown in FIG. 16A, the flip-flop RFF101 includes an AND circuit AND102. The AND102 receives the output (RFF101_CLK_IN) of the AND101 at one end and a data retention signal (RET signal) at the other end, and outputs a result of a logical AND operation between the output of the AND101 and the RET signal. An output (RFF101_CLK) of the AND102 serves as a clock signal for driving the flip-flop RFF101.

The clock gating circuit 102 includes a flip-flop FF102 and an OR circuit OR101. The flip-flop FF102 is driven by a positive edge of the clock signal CLKIN, and outputs a signal (FF102_OUT) obtained by inverting an enable signal EN2 at the timing of the positive edge. The OR101 receives the output of the flip-flop FF102 and the clock signal CLKIN, and outputs a result of a logical OR operation between the output of the flip-flop FF102 and the clock signal CLKIN.

The flip-flop RFF102 is a master-slave flip-flop capable of retaining data when an output (RFF102_CLK_IN) of the OR101 is at a high level. FIG. 16B is a diagram illustrating the flip-flop RFF102 (see Japanese Unexamined Patent Application Publication No. 2008-219491). As shown in FIG. 16B, the flip-flop RFF102 includes an OR circuit OR102. The OR102 receives the output (RFF102_CLK_IN) of the OR101 at one input and an inverted signal of the data retention signal (RET signal) at the other input, and outputs a result of a logical AND operation between the output of the OR101 and the inverted signal of the data retention signal. An output (RFF102_CLK) of the OR102 serves as a clock signal for driving the flip-flop RFF102.

FIGS. 17 and 18 are timing diagrams each illustrating the operation of the semiconductor device shown in FIG. 15. The flip-flops shown in FIGS. 16A and 17B are respectively used as the flip-flops RFF101 and RFF102. The timing diagram of FIG. 17 shows the operation of the clock gating circuit 101 and the flip-flop RFF101. As shown in FIG. 17, in the semiconductor device shown in FIG. 15, the clock signal CLKIN is fixed at the low level during a period between a timing T102 and a timing T105. During a period between a timing T103 and a timing T104, the RET signal becomes low level and the output (RFF101_CLK) of the AND102 is fixed at the low level.

First, the operation in the case where the enable signal EN1 is at a low level "0" during the period between the timing T102 and the timing T105 will be described. Until the timing T102, the output (RFF101_CLK_IN) of the AND101 and the output (RFF101_CLK) of the AND102 are in synchronization with the clock signal CLKIN. Meanwhile, after a timing T101, the enable signal EN1 becomes low level. As a result, the flip-flop FF101 outputs the signal (FF101_OUT) of low level to the AND101 at the timing T102, or at a negative edge of the clock signal CLKIN. Accordingly, the output (RFF101_CLK_IN) of the AND101 is fixed at the low level. In association with this, the output (RFF101_CLK) of the AND102 is also fixed at the low level. During the period between the timing T103 and the timing T104, the RET signal becomes low level and the output (RFF101_CLK_IN) of the AND101 is fixed at the low level. Accordingly, the output (RFF101_CLK) of the AND102 does not change.

At the timing T105, the clock signal CLKIN resumes operation and the enable signal EN1 becomes high level. As a result, the flip-flop FF101 outputs the signal (FF101_OUT) of high level to the AND101 at a timing T106, or at a negative edge of the clock signal CLKIN. Accordingly, the output (RFF101_CLK_IN) of the AND101 is synchronized with the clock signal CLKIN. Further, since the RET signal is at the high level, the output (RFF101_CLK) of the AND102 is also synchronized with the clock signal CLKIN.

Next, the operation in the case where the enable signal EN1 is at a high level "1" will be described. In this case, the enable signal EN1 is always at the high level, so the flip-flop FF101 always outputs a high-level signal to the AND101. Accordingly, the output (RFF101_CLK_IN) of the AND101 is output in synchronization with the clock signal CLKIN. Since the RET signal is at the high level during periods other than the period between the timing T103 and the timing T104, the output (RFF101_CLK) of the AND102 is also synchronized with the clock signal CLKIN. The RET signal is at the low level during the period between the timing T103 and the timing T104. However, since the clock signal CLKIN is fixed at the low level during the period between the timing T102 and the timing T105, the output (RFF101_CLK) of the AND102 does not change.

Referring next to FIG. 18, the operation of the clock gating circuit 102 and the flip-flop RFF102 will be described. As shown in FIG. 18, in the semiconductor device shown in FIG. 15, the clock signal CLKIN is fixed at the low level during a period between a timing T112 and a timing T115. During a period between a timing T113 and a timing T114, the RET signal is at the low level and the output (RFF102_CLK) of the 0R102 of the RFF102 is fixed at the high level.

First, the operation in the case where the enable signal EN2 is at the low level "0" during the period (between the timing T112 and the timing T115) when the clock signal CLKIN is fixed. Until a timing T111, the output (RFF102_CLK_IN) of the OR101 and the output (RFF102_CLK) of the OR102 are in synchronization with the clock signal CLKIN.

Meanwhile, after the timing T111, the enable signal EN2 becomes low level. As a result, the flip-flop FF102 outputs the signal (FF102_OUT) of high level to the OR101 at the timing T112, or at a positive edge of the clock signal CLKIN. Accordingly, the output (RFF102_CLK_IN) of the OR101 is fixed at the high level. In association with this, the output (RFF102_CLK) of the OR102 of the flip-flop RFF102 is also fixed at the high level. During the period between the timing T113 and the timing T114, the RET signal becomes low level. However, since the output (RFF102_CLK_IN) of the OR101 is fixed at the high level, the output (RFF102_CLK) of the OR102 of the flip-flop RFF102 does not change.

After the timing T115, the clock signal CLKIN resumes operation and the enable signal EN2 becomes high level. As a result, the flip-flop FF102 outputs the signal (FF102_OUT) of low level to the OR101 at a timing T116, or at a positive edge of the clock signal CLKIN. Accordingly, after the timing T116, the output (RFF102_CLK_IN) of the OR101 is synchronized with the clock signal CLKIN. Further, since the RET signal is at the high level, the output (RFF102_CLK) of the OR102 of the flip-flop RFF102 is also synchronized with the clock signal CLKIN.

Next, the operation in the case where the enable signal EN2 is at the high level "1" will be described. In this case, the enable signal EN2 is always at the high level, so the flip-flop FF102 always outputs a low-level signal to the OR101. Accordingly, the output (RFF102_CLK_IN) of the OR101 is output in synchronization with the clock signal CLKIN. Since the RET signal is at the high level during periods other than the period between the timing T113 and the timing T114, the output (RFF102_CLK) of the OR102 of the RFF102 is also synchronized with the clock signal CLKIN.

Meanwhile, the RET signal becomes low level during the period between the timing T113 and the timing T114. At this time, the clock signal CLKIN is fixed at the low level, so the output (RFF102_CLK_IN) of the OR101 is also fixed at the low level. For this reason, when the RET signal input to the OR102 of the REF102 becomes low level at the timing T113, the output (RFF102_CLK) of the 0R102 becomes high level. Further, when the RET signal becomes high level again at the timing T114, the output (REF102_CLK) of the 0R102 becomes low level.

Moreover, Japanese Unexamined Patent Application Publication No. 08-191234 discloses a technique relating to a D flip-flop circuit capable of always generating original output data without limiting the state of a control signal (RET signal) before power saving and the state of the control signal (RET signal) after power saving. The D flip-flop circuit disclosed in Japanese Unexamined Patent Application Publication No. 08-191234 includes a memory circuit which has a positive terminal and a negative terminal and to which another power supply that is different from a power supply used for master and slave units supplies power. The D flip-flop circuit disconnects a path between the negative terminal of the memory circuit and the input terminal of the master unit and a path between the positive terminal of the memory circuit and the input terminal of the slave unit when the D flip-flop circuit is in a power-saving state. In addition, the D flip-flop circuit disconnects the path between the negative terminal of the memory circuit and the input terminal of the master unit when the master unit and the slave unit are disconnected. In short, the use of the D flip-flop circuit disclosed in Japanese Unexamined Patent Application Publication No. 08-191234 enables retention of data at both the low level and the high level of the RET signal.

SUMMARY

In the semiconductor device shown in FIG. 15, as described above with reference to the timing diagram shown in FIG. 18, when the enable signal EN2 is at the high level, the data retention signal (RET signal) becomes low level at the timing T113, so that the operation clock (RFF102_CLK) of the flip-flop RFF102 rises. Further, when the data retention signal (RET signal) becomes high level at the timing T114, the clock (RFF102_CLK) of the flip-flop RFF102 falls. Thus, at the timing T114, the flip-flop RFF102 newly receives data (D), and the data of the flip-flop RFF102 changes after the clock signal CLKIN is fixed.

Meanwhile, when the enable signal EN2 is at the low during the period (between the timing T112 and the timing T115) when the clock signal CLKIN is fixed, the RET signal becomes low level during the period between the timing T113 and the timing T114. However, the clock (RFF102_CLK) of the flip-flop RFF102 does not change.

As described above, in the semiconductor device shown in FIG. 15, the data retained in the flip-flop RFF102 after the clock signal CLKIN is fixed varies depending on the value of the enable signal EN2. In other words, there is a problem that unintended latching of data occurs when data is retained in a flip-flop having a retention function.

A first aspect of the present invention is a semiconductor device including: a flip-flop that is driven in synchronization with a clock signal and retains data according to a data retention signal; a clock control circuit that controls the clock signal supplied to the flip-flop; and a controller that supplies an input clock signal to the clock control circuit, supplies the data retention signal to the flip-flop, and controls the clock control circuit. When the flip-flop is driven by a positive edge of the clock signal and retains data at a low level of the clock signal, the controller controls the clock control circuit so as to supply a low-level clock signal to the flip-flop after the input clock signal is fixed and before the flip-flop retains data. When the flip-flop is driven by a negative edge of the clock signal and holds data at a high level of the clock signal, the controller controls the clock control circuit so as to supply a high-level'clock signal to the flip-flop after the input clock signal is fixed and before the flip-flop retains data.

In the semiconductor device according to the first aspect of the present invention, a low-level clock signal is forcibly supplied to the flip-flop, which retains data when the clock signal is at the low level, before the data retention signal is supplied, by using the clock control circuit. Further, a high-level clock signal is forcibly supplied to the flip-flop, which retains data when the clock signal is at the high level, before the data retention signal is supplied, by using the clock control circuit. This makes it possible to prevent the occurrence of unintended latching of data when data is retained in the flip-flop.

A second aspect of the present invention is a method for controlling a flip-flop which is driven in synchronization with a clock signal and retains data according to a data retention signal, the method including: supplying a low-level clock signal to the flip-flop after the clock signal is fixed and before the flip-flop retains data, when the flip-flop is driven by a positive edge of the clock signal and retains data at a low level of the clock signal; and supplying a high-level clock signal to the flip-flop after the clock signal is fixed and before the flip-flop retains data, when the flip-flop is driven by a negative edge of the clock signal and retains data at a high level of the clock signal.

In the method for controlling a flip-flop according to the second aspect of the present invention, a low-level clock signal is forcibly supplied to the flip-flop, which retains data when the clock signal is at the low level, before the data retention signal is supplied. Further, a high-level clock signal is forcibly supplied to the flip-flop, which retains data when the clock signal is at the high level, before the data retention signal is supplied. This makes it possible to prevent the occurrence of unintended latching of data when data is retained in the flip-flop.

A third aspect of the present invention is a non-transitory computer readable medium storing a program for causing a computer to execute processing for inserting a clock control circuit into a circuit, the processing including: inserting a clock control circuit at a preceding stage of a flip-flop that is driven by a positive edge of a clock signal and retains data when the clock signal is at a low level, out of flip-flops that are driven in synchronization with the clock signal and retain data according to a data retention signal, the clock control circuit supplying a low-level clock signal to the flip-flop after the clock signal is fixed and before the flip-flop retains the data; and inserting a clock control circuit at a preceding stage of a flip-flop that is driven by a negative edge of the clock signal and retains data when the clock signal is at a high level, out of the flip-flops, the clock control circuit supplying a high-level clock signal to the flip-flop after the clock signal is fixed and before the flip-flop retains data.

In the program according to the third aspect of the present invention, the clock control circuit, which forcibly supplies a low-level clock signal before the data retention signal is supplied, is inserted at a preceding stage of the flip-flop that retains data when the clock signal is at the low level. Further, the clock control circuit, which forcibly supplies a high-level clock signal before the data retention signal is supplied, is inserted at a preceding stage of the flip-flop that retains data when the clock signal is at the high level. This prevents the occurrence of unintended latching of data when data is retained in the flip-flop.

According to an aspect of the present invention, it is possible to provide a semiconductor device capable of preventing the occurrence of unintended latching of data when data is retained in a flip-flop having a retention function, and a method for controlling a flip-flop.

BRIEF DESCRIPTION OF THE DRAWINGS

The above and other aspects, advantages and features will be more apparent from the following description of certain embodiments taken in conjunction with the accompanying drawings, in which:

FIG. 17 is a timing diagram illustrating operation of the semiconductor device according to the related art.

DETAILED DESCRIPTION

First Embodiment

Figure 1:
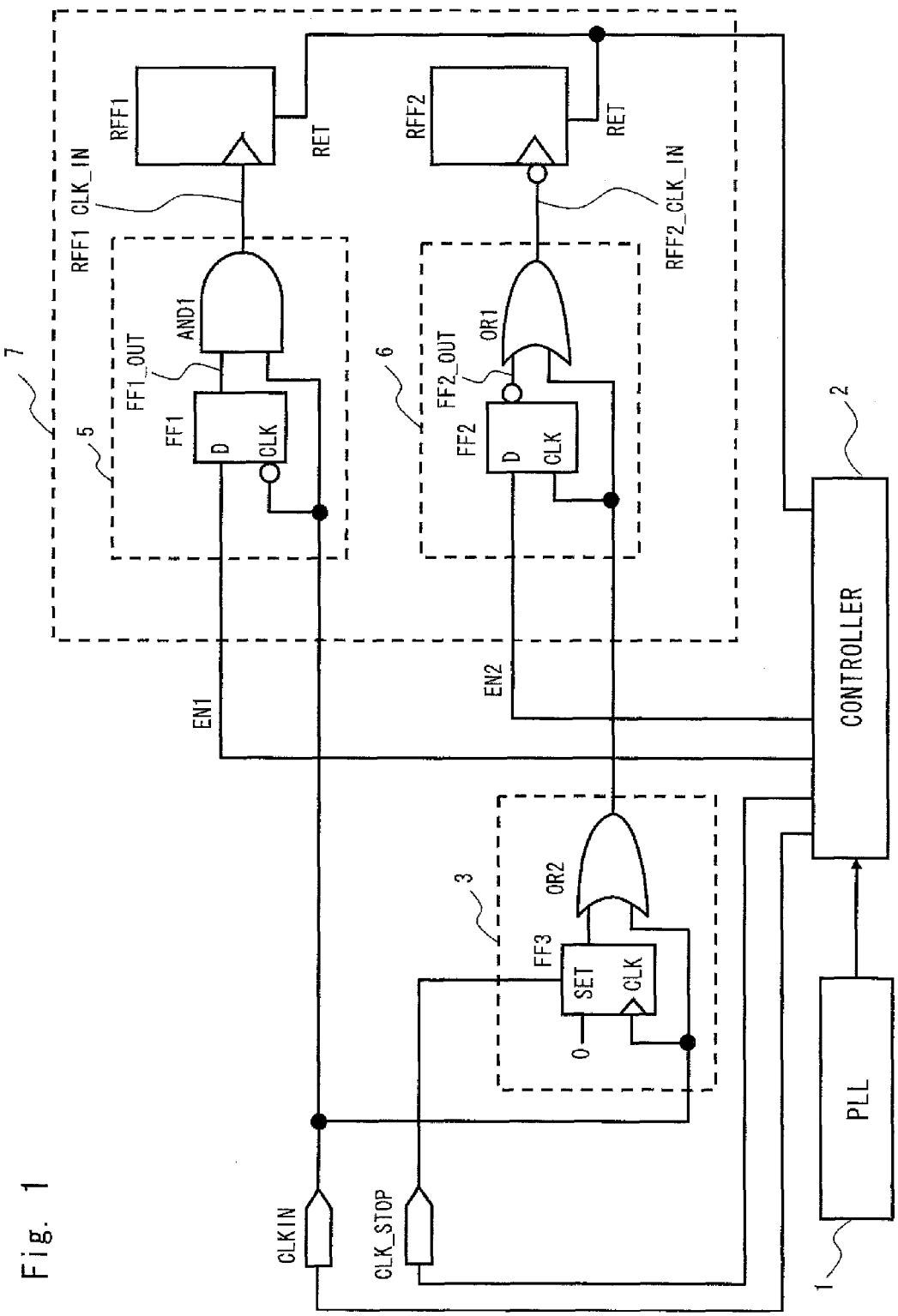
FIG. 1 is a circuit diagram illustrating a semiconductor device according to a first embodiment of the present invention.

Hereinafter, a first embodiment of the present invention will be described with reference to the drawings. FIG. 1 is a circuit diagram illustrating a semiconductor device according to the first embodiment. The semiconductor device according to the first embodiment includes a controller 2, a clock control circuit 3, clock gating circuits 5 and 6, and flip-flops RFF1 and RFF2 having a retention function (the RFF1 is a first flip-flop and the RFF2 is a second flip-flop). The clock gating circuits 5 and 6 and the flip-flops RFF1 and RFF2 constitute a logical circuit 7. The controller 2 receives a clock signal from an oscillating circuit 1 such as a PLL, generates a clock signal CLKIN based on the clock signal, and supplies the generated clock signal to each of the clock control circuit 3 and the clock gating circuits 5 and 6. The controller 2 also supplies a clock stop signal CLK_STOP to the clock control circuit 3, an enable signal EN1 to the clock gating circuit 5, an enable signal EN2 to the clock gating circuit 6, and a data retention signal (RET signal) to the flip-flops RFF1 and RFF2.

The clock gating circuit 5 (a first clock gating circuit) includes a flip-flop FF1 (a fifth flip-flop) and an AND circuit AND1 (a second AND circuit). The flip-flop FF1 is driven by a negative edge of the clock signal CLKIN supplied from the controller 2, and outputs a logical level (high level or low level) of the enable signal EN1 at the timing of the negative edge. The AND1 receives an output (FF1_OUT) of the flip-flop FF1 and the clock signal CLKIN, and outputs a result of a logical AND operation between the output of the flip-flop FF1 and the clock signal CLKIN.

Figure 16A:
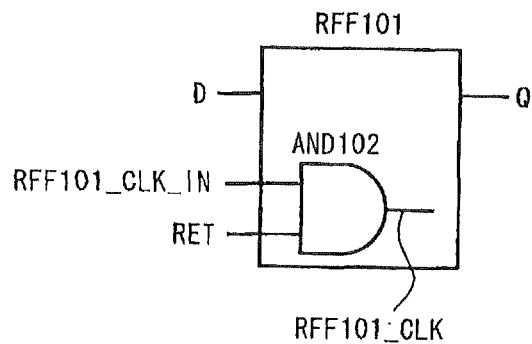
FIG. 16A is a diagram showing a flip-flop which is used in the semiconductor device according to the related art, has a retention function, and retains data when an input clock is at a low level.

The flip-flop RFF1 receives an output (RFF1_CLK_IN) of the AND1 of the clock gating circuit 5 and is driven by a positive edge of the signal. In this case, the flip-flop RFF1 is a flip-flop capable of retaining data when the output (RFF1_CLK_IN) of the AND1 of the clock gating circuit 5 is at the low level. As the flip-flop RFF1, the master-slave flip-flop shown in FIG. 16A can be used, for example. The flip-flop shown in FIG. 16A includes an AND circuit (a fifth AND circuit) which receives the clock signal at one input and the data retention signal (RET signal) at the other input, and which outputs a result of a logical AND operation between the clock signal and the RET signal. The signal output as the AND operation result of the AND circuit serves as a clock signal for driving the flip-flop. Further, the RET signal supplied to the flip-flop RFF1 is output from the controller 2.

The clock control circuit 3 (a second clock control circuit) includes a set flip-flop FF3 (a fourth flip-flop) and an OR circuit OR2 (a first OR circuit). The set flip-flop FF3 receives the clock signal CLKIN and outputs a logical level "0" (low level) at a positive edge of the clock signal CLKIN. Upon receiving the clock stop signal CLK_STOP from the controller 2, the set flip-flop FF3 outputs a high-level signal to the OR2. The OR2 receives the output of the set flip-flop FF3 and the clock signal CLKIN, and outputs a result of a logical OR operation between the output of the set flip-flop FF3 and the clock signal CLKIN. That is, the clock control circuit 3 outputs a signal in synchronization with the clock signal CLKIN upon not receiving the clock stop signal CLK_STOP, and outputs a high-level signal upon receiving the clock stop signal CLK_STOP.

The clock gating circuit 6 (a second clock gating circuit) includes a flip-flop FF2 (a sixth flip-flop) and an OR circuit OR1 (a second OR circuit). The flip-flop FF2 is driven by a positive edge of a signal output from the OR2 of the clock control circuit 3, and outputs a signal obtained by inverting the logical level (high level or low level) of the enable signal EN2 at the timing of the positive edge. The OR1 receives an output (FF2_OUT) of the flip-flop FF2 and the signal output from the OR2 of the clock control circuit 3, and outputs a result of a logical OR operation between the output of the flip-flop FF2 and the signal output from the OR2.

Figure 16B:
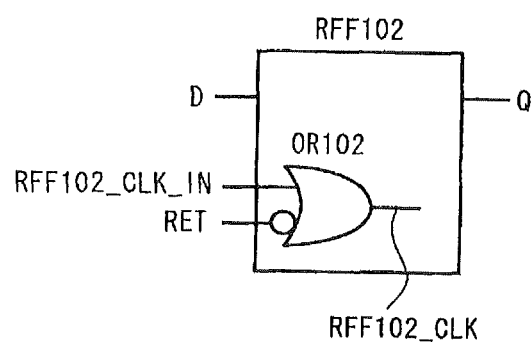
FIG. 16B is a diagram showing a flip-flop which is used in the semiconductor device according to the related art, has a retention function, and retains data when an input clock is at a high level.

The flip-flop RFF2 receives an output (RFF2_CLK_IN) of the OR1 of the clock gating circuit 6, and is driven by a negative edge of the signal. In this case, the flip-flop RFF2 is a flip-flop capable of retaining data when the output (RFF2_CLK_IN) of the OR1 of the clock gating circuit 6 is at the high level. As the flip-flop RFF2, the master-slave flip-flop shown in FIG. 16B can be used, for example. The flip-flop shown in FIG. 16B includes an OR circuit (a tenth OR circuit) which receives the clock signal at one input and the data retention signal (RET signal) at the other input, and which outputs a result of a logical OR operation between the clock signal and the RET signal. The signal output as the OR operation result of the OR circuit serves as a clock signal for driving the flip-flop. The RET signal supplied to the flip-flop RFF2 is output from the controller 2.

Figure 2:
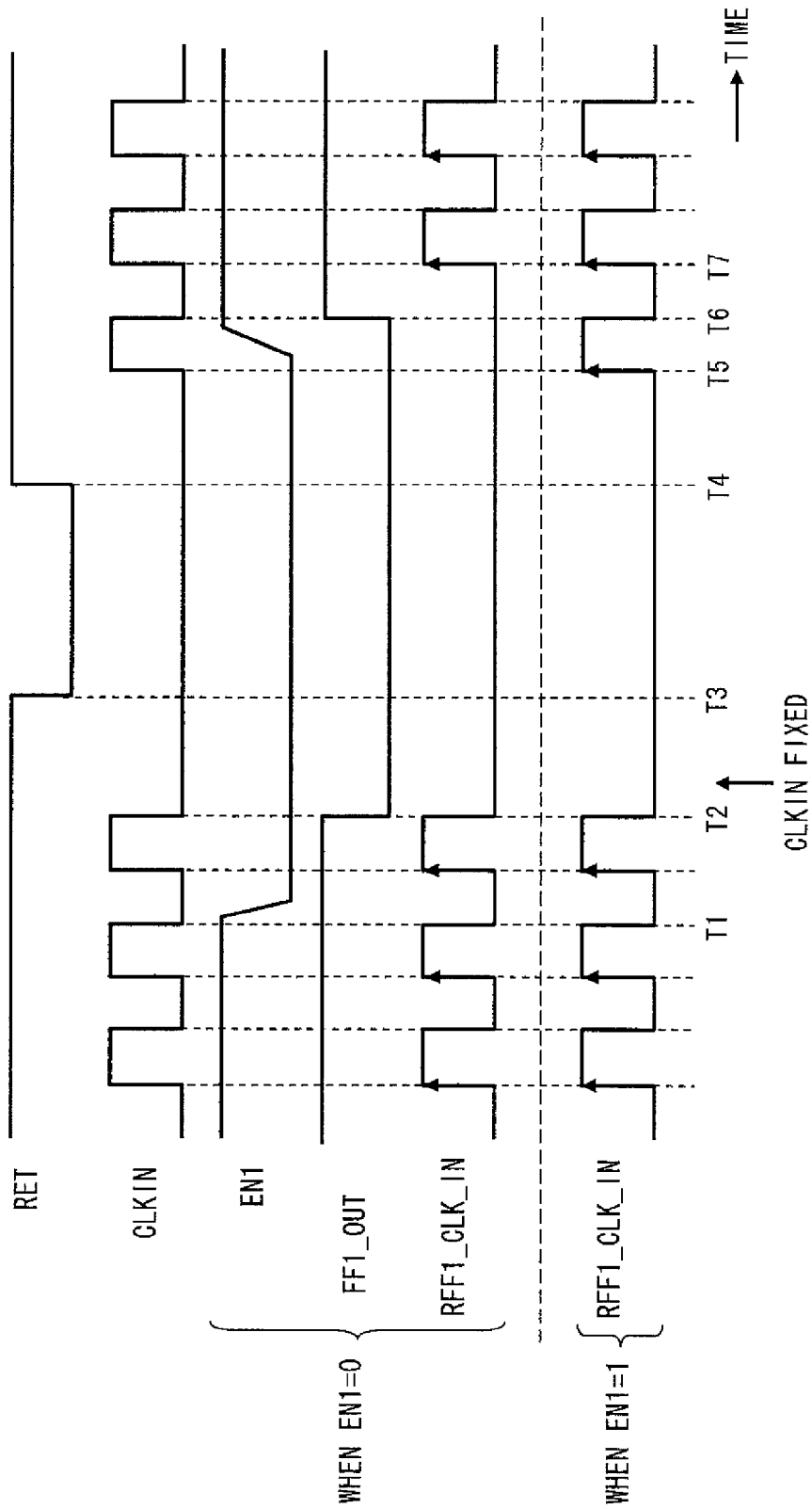
FIG. 2 is a timing diagram illustrating operation of the semiconductor device according to the first embodiment.

Next, operation of the semiconductor device according to the first embodiment will be described. FIG. 2 is a timing diagram illustrating the operation of the semiconductor device according to the first embodiment. The timing diagram of FIG. 2 shows the operation of the clock gating circuit 5 and the flip-flop RFF1. As shown in FIG. 2, in the semiconductor device according to the first embodiment, the clock signal CLKIN is fixed at the low level during a period between a timing T2 and a timing T5. The RET signal is at the low level during a period between a timing T3 and a timing T4.

First, the operation in the case where the enable signal EN1 supplied to the flip-flop FF1 is at the low level during the period between the timing T2 and the timing T5 will be described. Until a timing T1, the enable signal EN1 is at the high level, so the flip-flop FF1 outputs the signal (FF1_OUT) of high level to one input of the AND 1. Further, the clock signal CLKIN is supplied to the other input of the AND1. Accordingly, the output (RFF1_CLK_IN) is synchronized with the clock signal CLKIN.

When the enable signal EN1 becomes low level after the timing T1, the flip-flop FF1 outputs the signal (FF1_OUT) of low level to one input of the AND1 at the timing T2, or at a negative edge of the clock signal CLKIN. For this reason, the output (RFF1_CLK_IN) of the AND1 is fixed at the low level regardless of the level of the clock signal CLKIN. At this time, during the period between the timing T3 and the timing T4, the RET signal becomes low level and the flip-flop RFF1 retains data. In this case, the flip-flop RFF1 is a flip-flop capable of retaining data when the output (RFF1_CLK_IN) of the AND1 of the clock gating circuit 5 is at the low level. Therefore, the flip-flop RFF1 retains accurate values.

At the timing T5, the clock signal CLKIN resumes operation and the enable signal EN1 becomes high level. As a result, the flip-flop FF1 outputs the signal (FF1_OUT) of high level to the AND1 at a timing T6, or at a negative edge of the clock signal CLKIN. Accordingly, the output (RFF1_CLK_IN) of the AND1 is synchronized with the clock signal CLKIN.

Next, the operation in the case where the enable signal EN1 is at the high level will be described. In this case, the enable signal EN1 is always at the high level, so the flip-flop FF1 always outputs a high-level signal to one input of the AND1. Further, the clock signal CLKIN is supplied to the other input of the AND1. Accordingly, the output (RFF1_CLK_IN) of the AND1 is synchronized with the clock signal CLKIN. Further, since the clock signal CLKIN is fixed at the low level during the period between the timing T2 and the timing T5, the output (RFF1_CLK_IN) of the AND1 is also fixed at the low level. At this time, during the period between the timing T3 and the timing T4, the RET signal becomes low level and the flip-flop RFF1 retains data. In this case, the flip-flop RFF1 is a flip-flop capable of retaining data when the output (RFF1_CLK_IN) of the AND1 of the clock gating circuit 5 is at the low level. Therefore, the flip-lop RFF1 retains accurate values.

Figure 3:
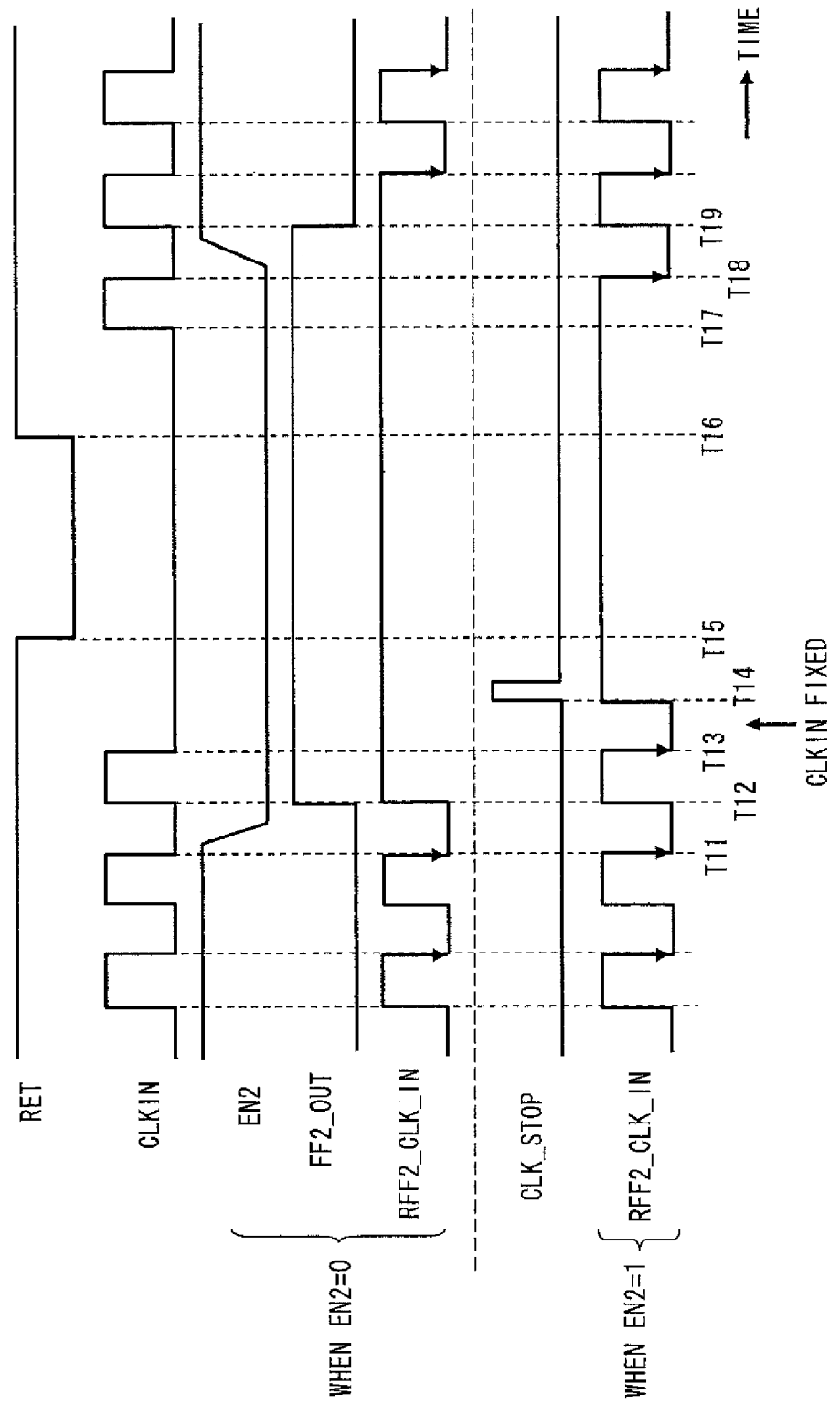
FIG. 3 is a timing diagram illustrating operation of the semiconductor device according to the first embodiment.

Referring next to FIG. 3, the operation of the clock control circuit 3, the clock gating circuit 6, and the flip-flop RFF2 will be described. As shown in FIG. 3, in the semiconductor device according to the first embodiment, during a period between a timing T13 and a timing T17, the clock signal CLKIN is fixed at the low level. During a period between a timing T15 and a timing T16, the RET signal is at the low level. At a timing T14, the clock stop signal CLK_STOP is supplied to the set flip-flop FF3 of the clock control circuit 3 in a pulse-like manner.

First, the operation in the case where the enable signal EN2 supplied to the flip-flop FF2 is at the low level during the period between a timing T12 and a timing T18 will be described. Until a timing T11, the enable signal EN2 is at the high level, so the flip-flop FF2 outputs the signal (FF2_OUT) of high level to one input of the OR1. Further, the output of the clock control circuit 3 is supplied to the other input of the OR1. In this case, the clock control circuit 3 outputs a signal in synchronization with the clock signal CLKIN to the clock gating circuit 6 upon not receiving the clock stop signal CLK_STOP. Accordingly, the output (RFF2_CLK_IN) of the OR1 is synchronized with the clock signal CLKIN.

When the enable signal EN2 becomes low level after the timing T11, the flip-flop FF2 outputs the signal (FF2_OUT) of high level to one input of the OR1 at the timing T12, or at a positive edge of the clock signal CLKIN. For this reason, the output (RFF2_CLK_IN) of the OR1 is fixed at the high level regardless of the level of the clock signal CLKIN. In this case, at the timing T14, the clock stop signal CLK_STOP is supplied to the set flip-flop FF3 of the clock control circuit 3 in a pulse-like manner. However, the output (RFF2_CLK_IN) of the OR1 does not change, because the output is already fixed at the high level. At this time, during the period between the timing T15 and the timing T16, the RET signal becomes low level and the flip-flop RFF2 retains data. In this case, the flip-flop RFF2 is a flip-flop capable of retaining data when the output (RFF2_CLK_IN) of the OR1 of the clock gating circuit 6 is at the high level. Therefore, the flip-flop RFF2 retains accurate values.

At the timing T17, the clock signal CLKIN resumes operation and the enable signal EN2 becomes high level. As a result, the flip-flop FF2 outputs the signal (FF2_OUT) of low level to the OR1 at a timing T19, or at a positive edge of the clock signal CLKIN. Accordingly, the output (RFF2_CLK_IN) of the OR1 is synchronized with the clock signal CLKIN.

Next, the operation in the case where the enable signal EN2 is at the high level will be described. In this case, the enable signal EN2 is always at the high level, so the flip-flop FF2 always outputs a low-level signal to one input of the OR1. Further, the clock signal CLKIN is supplied to the other input of the OR1. Accordingly, the output (RFF2_CLK_IN) of the OR1 is synchronized with the clock signal CLKIN.

Meanwhile, when the clock signal CLKIN is fixed at the low level at the timing T13, the output (RFF2_CLK_IN) of the OR1 is also fixed at the low level. At the timing T14 which is after the clock signal CLKIN is fixed at the low level (after the timing T13) and before the RET signal becomes low level (before the timing T14), the controller 2 supplies the clock stop signal CLK_STOP to the set flip-flop FF3 of the clock control circuit 3. Thus, the set flip-flop FF3 supplies a high-level signal to the OR2, so the OR2 outputs a high-level signal to one input of the OR1. Accordingly, the output (RFF2_CLK_IN) of the OR1 is fixed at the high level.

At this time, during the period between the timing T15 and the timing T16, the RET signal becomes low level and the flip-flop RFF2 retains data. In this case, the flip-flop RFF2 is a flip-flop capable of retaining data when the output (RFF2_CLK_IN) of the OR1 of the clock gating circuit 6 is at the high level. Therefore, the flip-flop RFF2 retains accurate values.

During the period when the value of the clock signal CLKIN supplied to the set flip-flop FF3 is fixed at the low level, the set flip-flop FF3 continuously supplies high-level signals to the OR2. When the clock signal CLKIN becomes high level at the timing T17, the set flip-flop FF3 supplies a low-level signal to the OR2. Accordingly, the OR2 outputs a signal in synchronization with the clock signal CLKIN to one input of the OR1. After that, the output (RFF2_CLK_IN) of the OR1 is synchronized with the clock signal CLKIN.

Note that the clock stop signal CLK_STOP may be supplied in a pulse-like manner as shown in FIG. 3, or may be supplied so to be maintained at the high level for a certain period of time, for example. In other words, the clock stop signal CLK_STOP may be arbitrarily selected as long as the clock stop signal is supplied so as to become high level after the clock signal CLKIN is fixed (after the timing T13) and before the RET signal becomes low level (before the timing T15), and to become low level before the timing at which the clock signal CLKIN resumes operation (before the timing T17).

In the semiconductor device according to the first embodiment, even in the case where the signal (RFF2_CLK_IN) input to the flip-flop RFF2 capable of retaining data at the time of high level is fixed at the low level when the clock signal CLKIN is fixed, the signal can be forcibly set to the high level by using the clock control circuit 3. This configuration enables the flip-flop RFF2 to retain accurate data.

Figure 15:
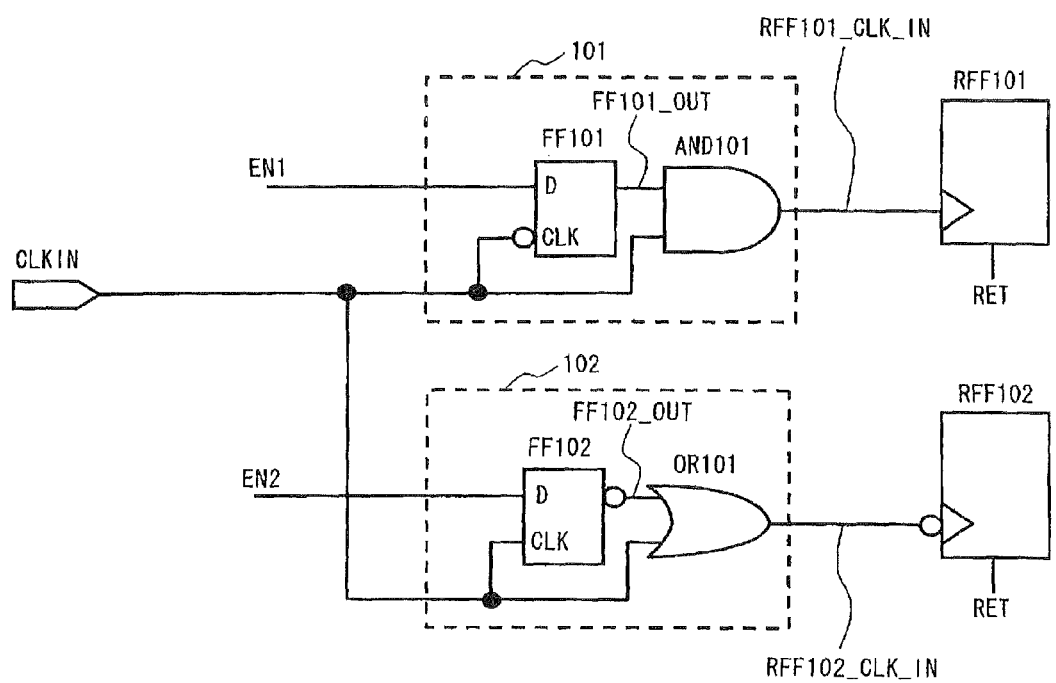
FIG. 15 is a circuit diagram illustrating a semiconductor device according to a related art.
Figure 18:
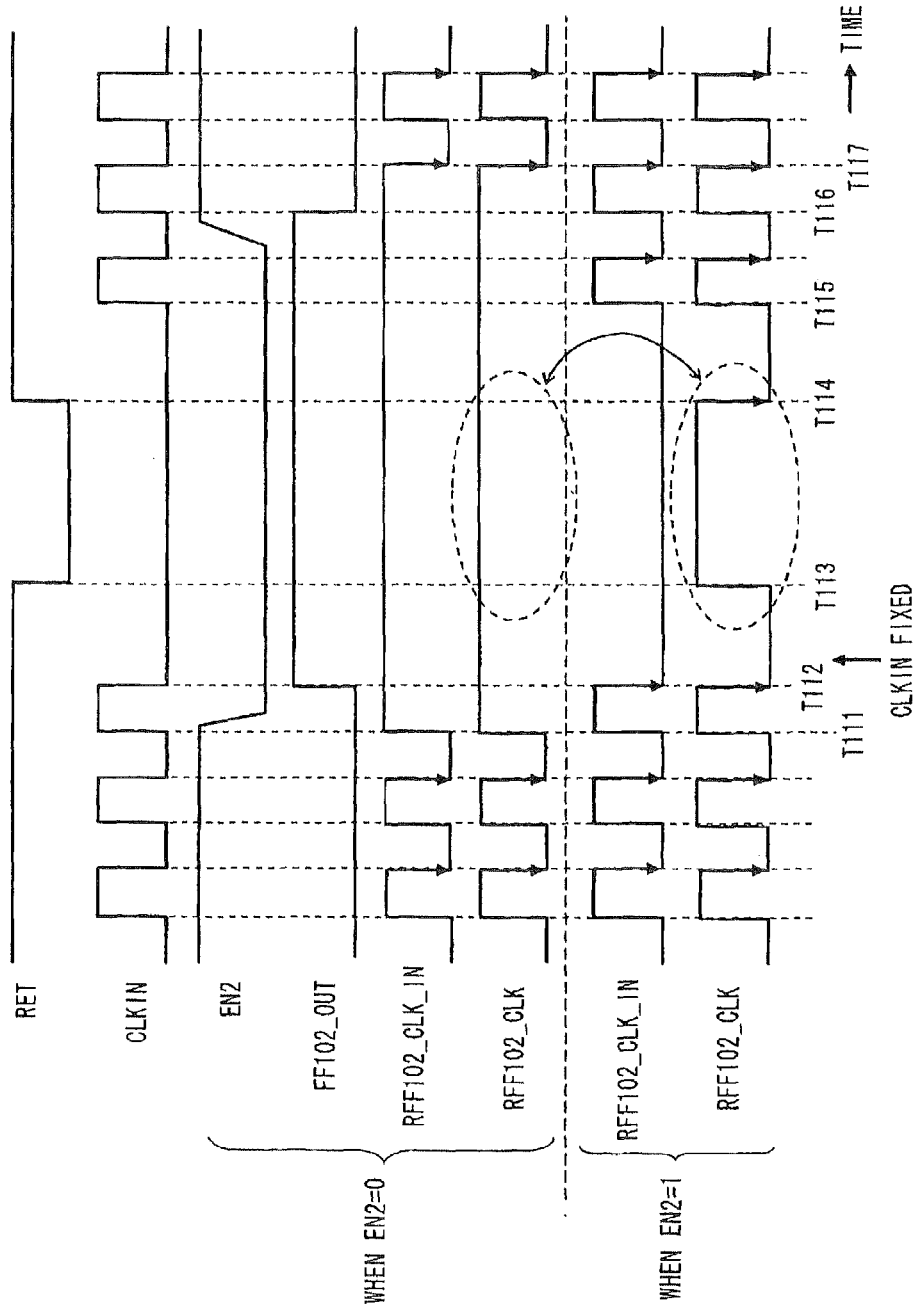
FIG. 18 is a timing diagram illustrating operation of the semiconductor device according to the related art.

That is, in the semiconductor device according to the related art shown in FIG. 15, the data retained in the flip-flop RFF102 after the clock signal CLKIN is fixed varies depending on the value of the enable signal EN2 as shown in FIG. 18. This causes a problem that unintended latching of data occurs when the flip-flop retains data using the retention function.

In the semiconductor device according to the first embodiment, when the signal (RFF2_CLK_IN) input to the flip-flop RFF2 is forcibly set to the high level by using the clock control circuit 3, the signal (RFF2_CLK_IN) input to the flip-flop RFF2 can be set to the high level regardless of the value of the enable signal EN2. Consequently, the semiconductor device according to the first embodiment can prevent the occurrence of unintended latching of data when the flip-flop having a retention function retains data.

Second Embodiment

Figure 4:
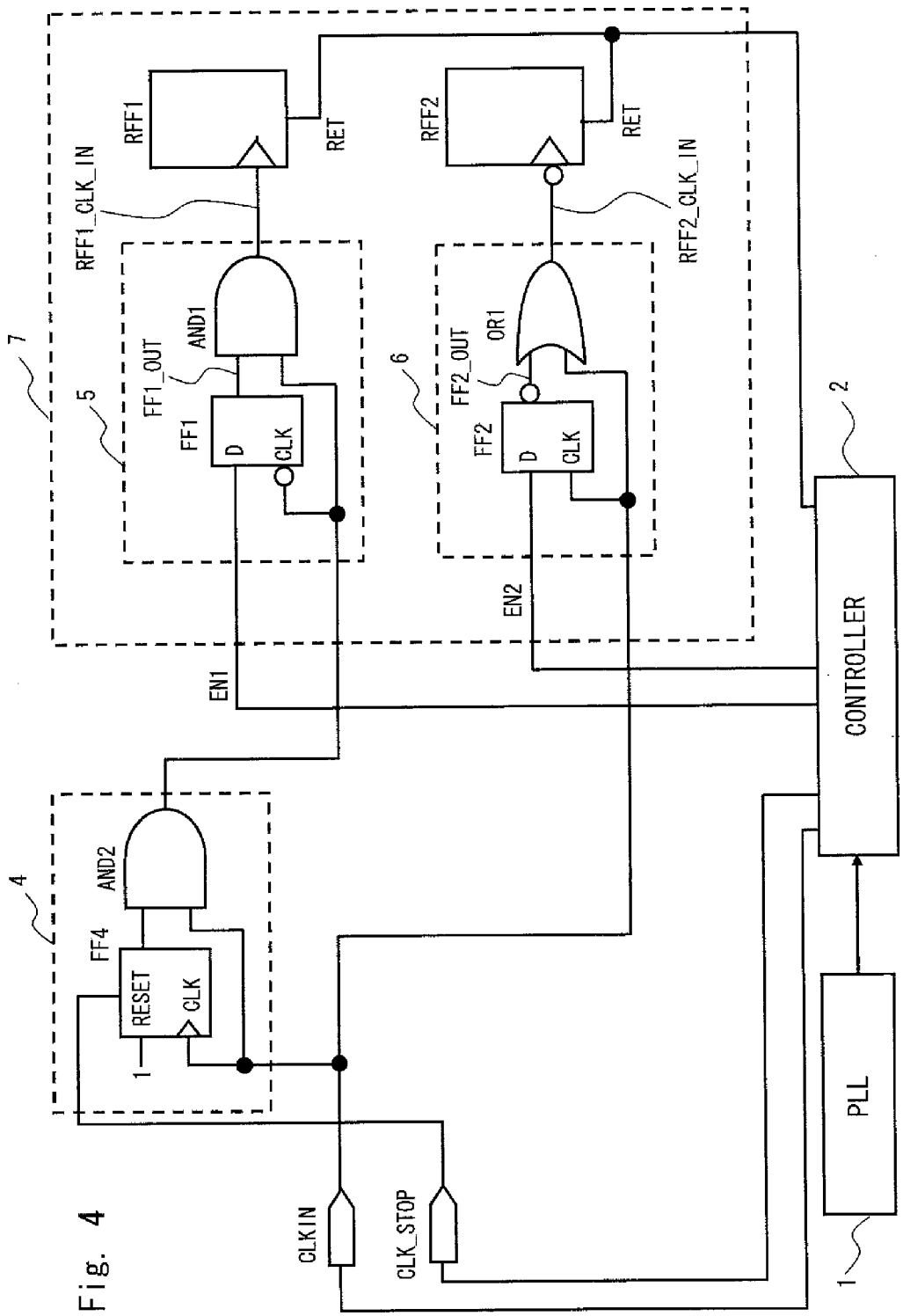
FIG. 4 is a circuit diagram illustrating a semiconductor device according to a second embodiment of the present invention.

FIG. 4 is a circuit diagram illustrating a semiconductor device according to a second embodiment of the present invention. The semiconductor device according to the second embodiment includes a controller 2, a clock control circuit 4, clock gating circuits 5 and 6, and flip-flops RFF1 and RFF2 having a retention function. The clock gating circuits 5 and 6 and the flip-flops RFF1 and RFF2 constitute a logical circuit 7. The controller 2 receives a clock signal from an oscillating circuit 1 such as a PLL, generates a clock signal CLKIN based on the clock signal, and supplies the generated clock signal to each of the clock control circuit 4 and the clock gating circuits 5 and 6. The controller 2 also supplies a clock stop signal CLK_STOP to the clock control circuit 4, an enable signal EN1 to the clock gating circuit 5, an enable signal EN2 to the clock gating circuit 6, and a data retention signal (RET signal) to the flip-flops RFF1 and RFF2.

The clock control circuit 4 (a first clock control circuit) includes a reset flip-flop FF4 (a third flip-flop) and an AND circuit AND2 (a first AND circuit). The reset flip-flop FF4 receives the clock signal CLKIN and outputs a logical level "1" (high level) at a positive edge of the clock signal CLKIN. Upon receiving the clock stop signal CLK_STOP from the controller 2, the reset flip-flop FF4 outputs a low-level signal to the AND2. The AND2 receives the output of the reset flip-flop FF4 and the clock signal CLKIN, and outputs a result of a logical AND operation between the output of the reset flip-flop FF4 and the clock signal CLKIN. That is, the clock control circuit 4 outputs a signal in synchronization with the clock signal CLKIN upon not receiving the clock stop signal CLK_STOP, and outputs a low-level signal upon receiving the clock stop signal CLK_STOP.

The clock gating circuit 5 includes a flip-flop FF1 and an AND circuit AND1. The flip-flop FF1 is driven by a negative edge of a signal output from the AND 2 of the clock control circuit 4, and outputs a logical level (high level or low level) of the enable signal EN1 at the timing of the negative edge. The AND1 receives an output (FF1_OUT) of the flip-flop FF1 and the output of the AND2 of the clock control circuit 4, and outputs a result of a logical AND operation between the output of the flip-flop FF1 and the output of the AND2.

The flip-flop RFF1 receives an output (RFF1_CLK_IN) of the AND1 of the clock gating circuit 5, and is driven by a positive edge of the signal. In this case, the flip-flop RFF1 is a flip-flop capable of retaining data when the output (RFF1_CLK_IN) of the AND1 of the clock gating circuit 5 is at the low level. As the flip-flop RFF1, the master-slave flip-flop shown in FIG. 16A can be used, for example. The flip-flop shown in FIG. 16A includes an AND circuit (AND circuit) which receives the clock signal at one input and the data retention signal (RET signal) at the other input, and outputs the data retention signal (RET signal) at another input, and which outputs a result of a logical AND operation between the clock signal and the RET signal. The signal output as the AND operation result of the AND circuit serves as a clock signal for driving the flip-flop. Further, the RET signal supplied to the flip-flop RFF1 is output from the controller 2.

The clock gating circuit 6 includes a flip-flop FF2 and an OR circuit OR1. The flip-flop FF2 is driven by a positive edge of the clock signal CLKIN supplied from the controller 2, and outputs a signal obtained by inverting the logical level (high level or low level) of the enable signal EN2 at the timing of the positive edge. The OR circuit OR1 receives an output (FF2_OUT) of the flip-flop FF2 and the clock signal CLKIN, and outputs a result of a logical OR operation between the output of the flip-flop FF2 and the clock signal CLKIN.

The flip-flop RFF2 receives an output (RFF2_CLK_IN) of the clock gating circuit 6, and is driven by a negative edge of the signal. In this case, the flip-flop RFF2 is a flip-flop capable of retaining data when the output (RFF2_CLK_IN) of the OR circuit OR1 of the clock gating circuit 6 is at the high level. As the flip-flop RFF2, the master-slave flip-flop shown in FIG. 16B can be used, for example. The flip-flop shown in FIG. 16B includes an OR circuit (OR circuit) which receives the clock signal at one input and the data retention signal (RET signal) at another input, and which outputs a result of a logical OR operation between the clock signal and the RET signal. The signal output as the OR operation result of the OR circuit serves as a clock signal for driving the flip-flop. Further, the RET signal supplied to the flip-flop RFF2 is output from the controller 2.

Figure 5:
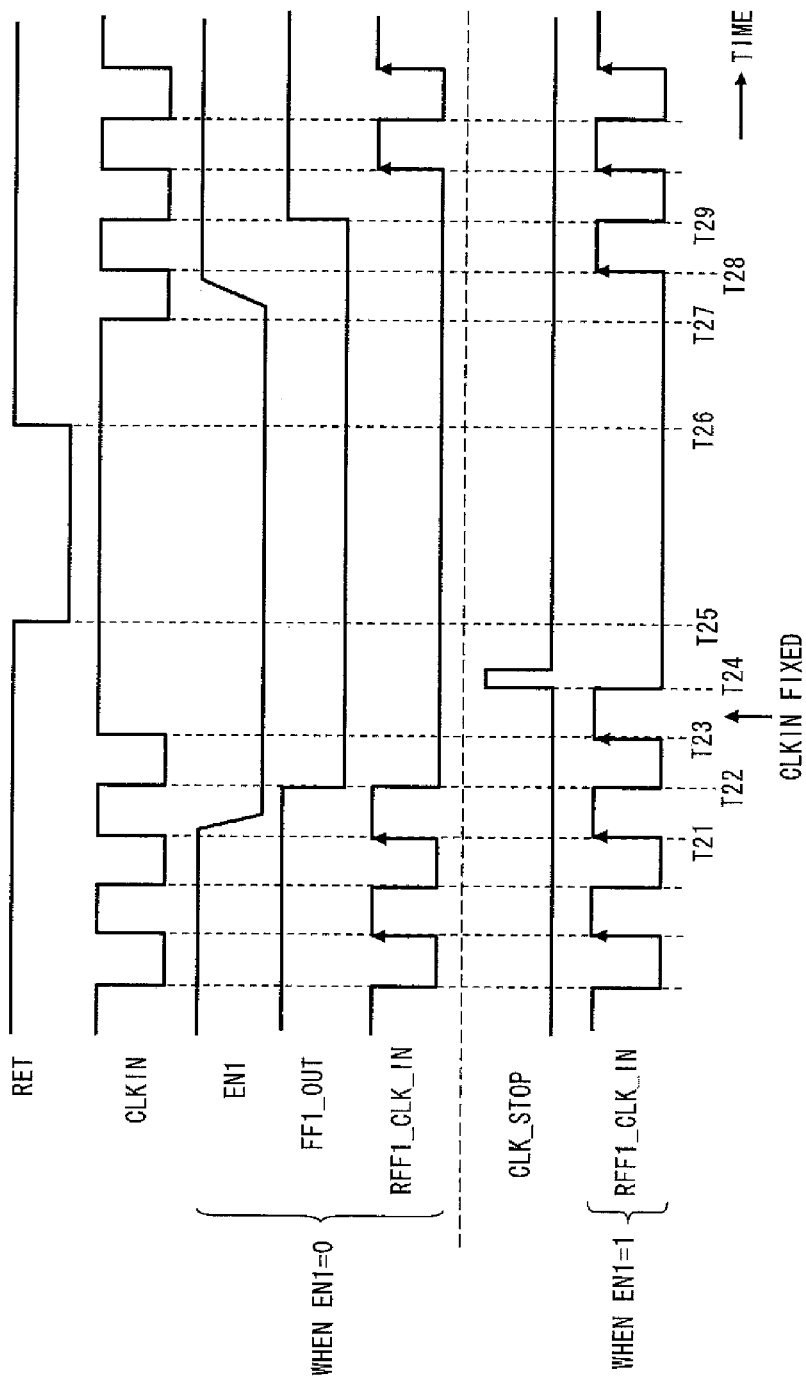
FIG. 5 is a timing diagram illustrating operation of the semiconductor device according to the second embodiment.

Next, operation of the semiconductor device according to the second embodiment will be described. FIG. 5 is a timing diagram illustrating the operation of the semiconductor device according to the second embodiment. The timing diagram of FIG. 5 shows the operation of the clock control circuit 4, the clock gating circuit 5, and the flip-flop RFF1.

As shown in FIG. 5, in the semiconductor device according to the second embodiment, the clock signal CLKIN is fixed at the high level during a period between a timing T23 and a timing T27. During a period between a timing T25 and a timing T26, the RET signal becomes low level. At a timing T24, the clock stop signal CLK_STOP is supplied to the reset flip-flop FF4 of the clock control circuit 4.

First, the operation in the case where the enable signal EN1 supplied to the flip-flop FF1 is at the low level during a period between a timing T22 and the timing T27 will be described. Until a timing T21, the enable signal EN1 is at the high level, so the flip-flop FF1 outputs the signal (FF1_OUT) of high level to one input of the AND1. Further, the output of the clock control circuit 4 is supplied to the other input of the AND1. In this case, upon not receiving the clock stop signal CLK_STOP, the clock control circuit 4 outputs a signal in synchronization with the clock signal CLKIN to the clock gating circuit 5. Accordingly, the output (RFF1_CLK_IN) of the AND1 is synchronized with the clock signal CLKIN.

When the enable signal EN1 becomes low level after the timing T21, the flip-flop FF1 outputs the signal (FF1_OUT) of low level to one input of the AND1 at the timing T22, or at a negative edge of the clock signal CLKIN. For this reason, the output (RFF1_CLK_IN) of the AND1 is fixed at the low level regardless of the level of the clock signal CLKIN. In this case, at the timing T24, the clock stop signal CLK_STOP is supplied to the reset flip-flop FF4 of the clock control circuit 4 in a pulse-like manner. However, since the output (RFF1_CLK_IN) of the AND1 is fixed at the low level, the output (RFF1_CLK_IN) of the AND1 does not change. Also in this case, during the period between the timing T25 and the timing T26, the RET signal becomes low level and the flip-flop RFF1 retains data. In this case, the flip-flop RFF1 is a flip-flop capable of retaining data when the output (RFF1_CLK_IN) of the AND1 of the clock gating circuit 5 is at the low level. Therefore, the flip-flop RFF1 retains accurate values.

At the timing T27, the clock signal CLKIN resumes operation and the enable signal EN1 becomes high level. As a result, at a timing T29, or at a negative edge of the clock signal CLKIN, the flip-flop FF1 outputs the signal (FF1_OUT) of high level to the AND1. Accordingly, the output (RFF1_CLK_IN) of the AND1 is synchronized with the clock signal CLKIN.

Next, the operation in the case where the enable signal EN1 is at the high level will be described. In this case, the enable signal EN1 is always at the high level, so the flip-flop FF1 always outputs a high-level signal to one input of the AND1. Further, the output of the clock control circuit 4, which is synchronized with the clock signal CLKIN, is supplied to the other input of the AND1. Accordingly, the output (RFF1_CLK_IN) of the AND1 is synchronized with the clock signal CLKIN.

Meanwhile, when the clock signal CLKIN becomes high level at the timing T23, the output (RFF1_CLK_IN) of the AND1 is also fixed at the high level. At the timing T24 which is after the clock signal CLKIN is fixed at the high level (after the timing T23) and before the RET signal becomes low level (before the timing T24), the controller 2 supplies the clock stop signal CLK_STOP in a pulse-like manner to the reset flip-flop FF4 of the clock control circuit 4. As a result, the AND2 outputs a low-level signal to one input of the AND1, because the reset flip-flop FF4 supplies a low-level signal to the AND2. Accordingly, the output (RFF1_CLK_IN) of the AND1 is fixed at the low level.

At this time, during the period between the timing T25 and the timing T26, the RET signal becomes low level and the flip-flop RFF1 retains data. In this case, the flip-flop RFF1 is a flip-flop capable of retaining data when the output (RFF1_CLK_IN) of the AND1 of the clock gating circuit 5 is at the low level. Therefore, the flip-flop RFF1 retains accurate values.

During the period when the value of the clock signal CLKIN supplied to the reset flip-flop FF4 is fixed at the high level, the reset flip-flop FF4 continuously supplies low-level signals to the AND2. When the clock signal CLKIN becomes low level at the timing T27, the reset flip-flop FF4 supplies a high-level signal to the AND2. Accordingly, the AND2 outputs a signal in synchronization with the clock signal CLKIN. After that, the output (RFF1_CLK_IN) of the AND1 is synchronized with the clock signal CLKIN.

Note that the clock stop signal CLK_STOP may be supplied in a pulse-like manner as shown in FIG. 5, or may be supplied so as to be maintained at the high level for a certain period of time, for example. In other words, the clock stop signal CLK_STOP may be arbitrarily selected as long as the clock stop signal is supplied so as to become high level after the clock signal CLKIN is fixed (after the timing T23) and before the RET signal becomes low level (before the timing T25), and to become low level before the timing at which the clock signal CLKIN resumes operation (before the timing T27).

Figure 6:
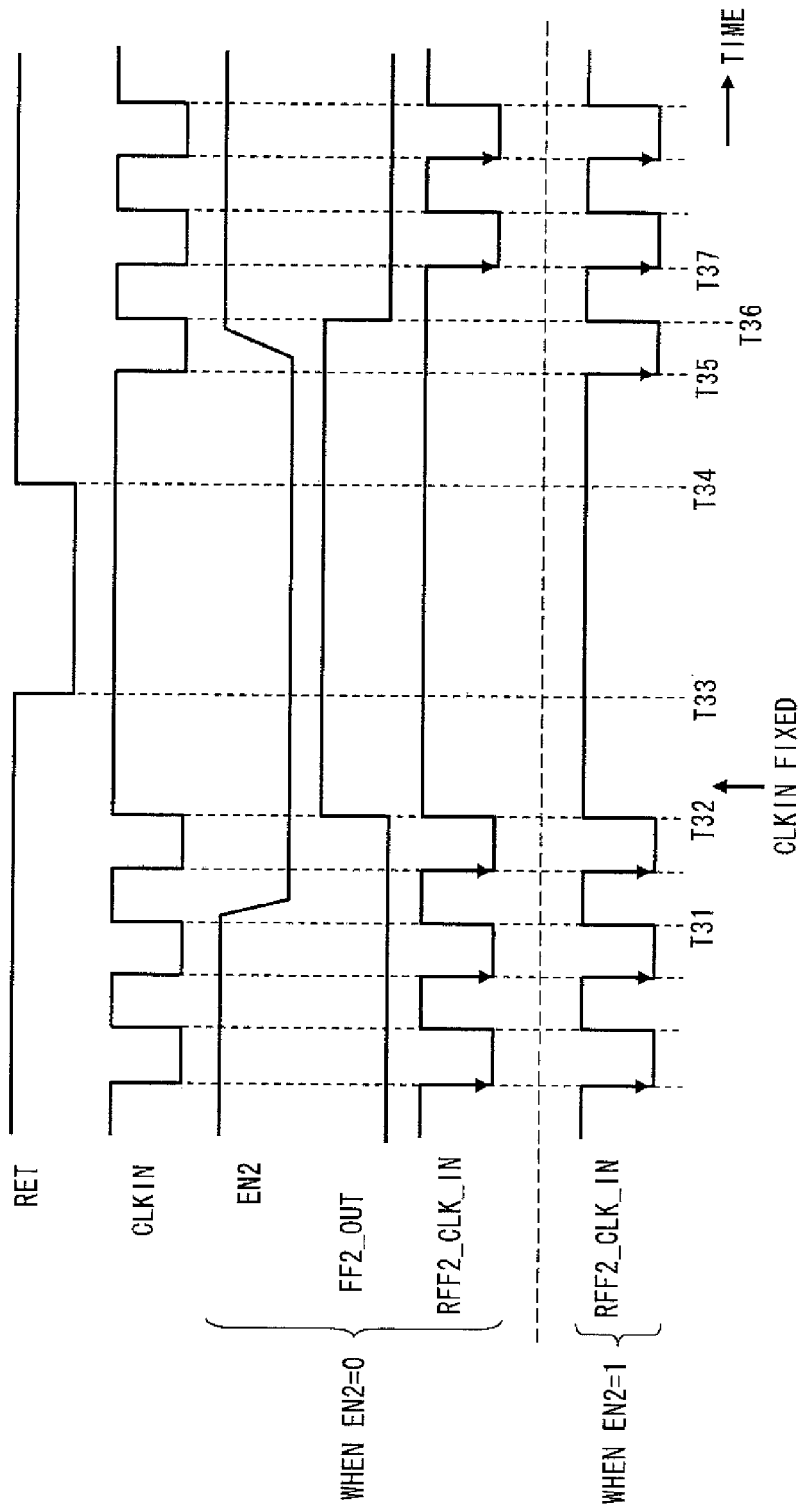
FIG. 6 is a timing diagram illustrating operation of the semiconductor device according to the second embodiment.

Next, the operation of the clock gating circuit 6 and the flip-flop RFF2 will be described with reference to the timing diagram of FIG. 6. As shown in FIG. 6, during a period between a timing T32 and a timing T35, the clock signal CLKIN is fixed at the high level. During a period between a timing T33 and a timing T34, the RET signal is at the low level.

First, the operation in the case where the enable signal EN2 supplied to the flip-flop FF2 is at the low level during the period between the timing T32 and the timing T35 will be described. Until a timing T31, the enable signal EN2 is at the high level, so the flip-flop FF2 outputs the signal (FF2_OUT) of low level to one input of the OR1. Further, the clock signal CLKIN is supplied to the other input of the OR1. Accordingly, the output (RFF2_CLK_IN) of the OR1 is synchronized with the clock signal CLKIN.

When the enable signal EN2 becomes low level after the timing T31, the flip-flop FF2 outputs the signal (FF2_OUT) of high level to one input of the OR1 at the timing T32, or at a positive edge of the clock signal CLKIN. For this reason, the output (RFF2_CLK_IN) of the OR1 is fixed at the high level regardless of the level of the clock signal CLKIN. At this time, during the period between the timing T33 and the timing T34, the RET signal becomes low level and the flip-flop RFF2 retains data. In this case, the flip-flop RFF2 is a flip-flop capable of retaining data when the output (RFF2_CLK_IN) of the clock gating circuit 6 is at the high level. Therefore, the flip-flop RFF2 retains accurate values.

At the timing T35, the clock signal CLKIN resumes operation and the enable signal EN2 becomes high level. As a result, the flip-flop FF2 outputs the signal (FF2_OUT) of low level to the OR1 at a timing T36, or at a positive edge of the clock signal CLKIN. Accordingly, the output (RFF2_CLK_IN) of the OR1 is synchronized with the clock signal CLKIN.

Next, the operation in the case where the enable signal EN2 is at the high level will be described. In this case, the enable signal EN2 is always at the high level, so the flip-flop FF2 always outputs a low-level signal to one input of the OR1. Further, the clock signal CLKIN is supplied to the other input of the OR1. Accordingly, the output (RFF2_CLK_IN) of the OR1 is synchronized with the clock signal CLKIN. Since the clock signal CLKIN is fixed at the high level during the period between the timing T32 and the timing T35, the output (RFF2_CLK_IN) of the OR1 is also fixed at the high level. At this time, during the period between the timing T33 and the timing T34, the RET signal becomes low level and the flip-flop RFF2 retains data. In this case, the flip-flop RFF2 is a flip-flop capable of retaining data when the output (RFF2_CLK_IN) of the OR1 of the clock gating circuit 6 is at the high level. Therefore, the flip-flop RFF2 retains accurate values.

In the semiconductor device according to the second embodiment, even in the case where the signal (RFF1_CLK_IN) input to the flip-flop RFF1 capable of retaining data at the time of low level is fixed at the high level when the clock signal CLKIN is fixed, the signal can be forcibly set to the low level by using the clock control circuit 4. This configuration enables the flip-flop RFF1 to retain accurate data.

That is, in the semiconductor device according to the second embodiment, the signal (RFF1_CLK_IN) input to the flip-flop RFF1 is forcibly set to the low level by using the clock control circuit 4. This makes it possible to set the level of the signal (RFF1_CLK_IN) input to the flip-flop RFF1 to the low level regardless of the value of the enable signal EN1. Consequently, the semiconductor device according to the second embodiment can prevent the occurrence of unintended latching of data when the flip-flop having a retention function retains data.

The first embodiment has exemplified the case in which the clock control circuit 3 is provided, and the second embodiment has exemplified the case in which the clock control circuit 4 is provided. Alternatively, the present invention may include both the clock control circuit 3 and the clock control circuit 4 at the same time. The provision of both the clock control circuits 3 and 4 makes it possible to deal with the case where the clock signal CLKIN is fixed at the low level (first embodiment) and also the case where the clock signal CLKIN is fixed at the high level (second embodiment).

Third Embodiment

Figure 7:
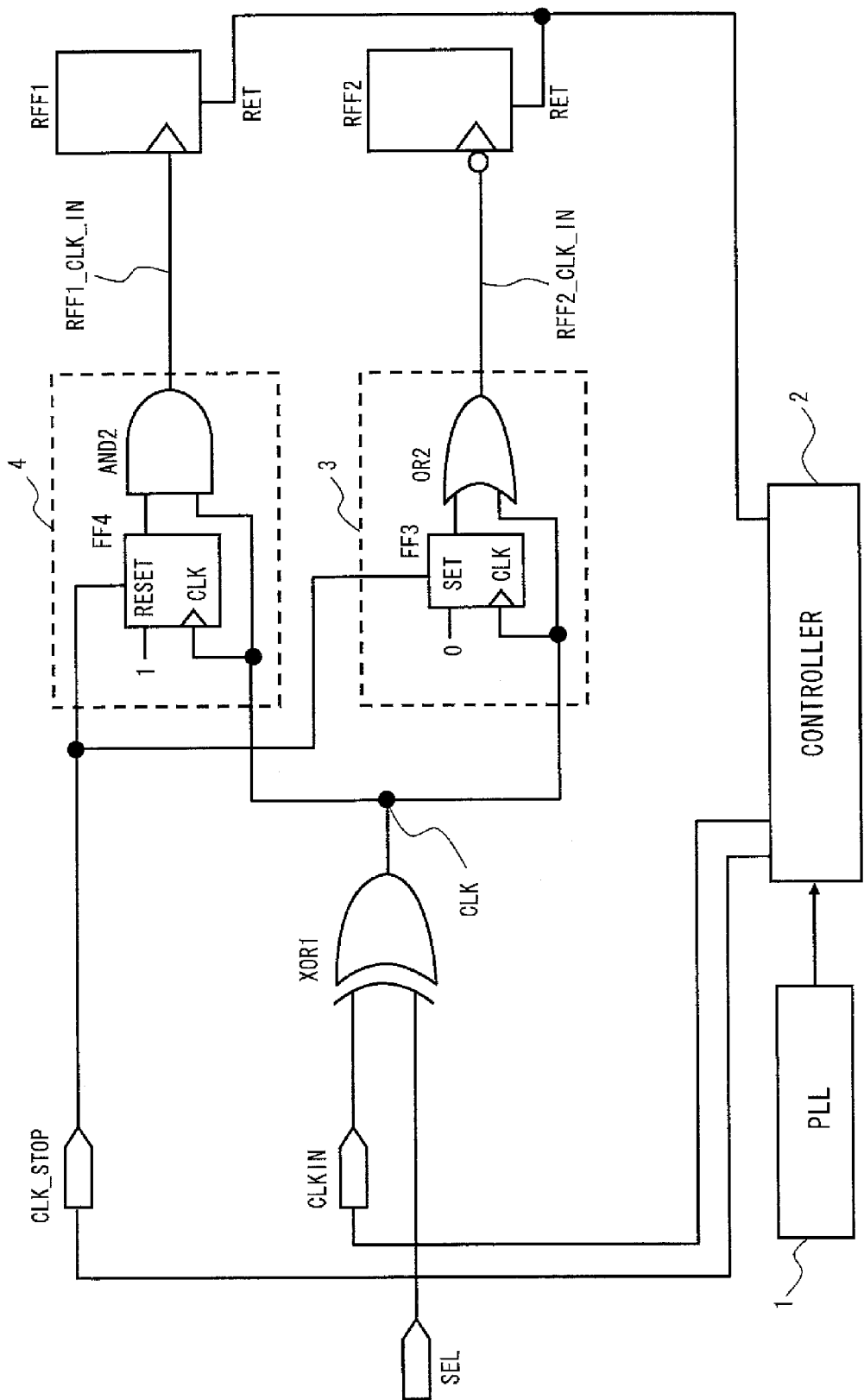
FIG. 7 is a circuit diagram illustrating a semiconductor device according to a third embodiment of the present invention.

Next, a third embodiment of the present invention will be described. FIG. 7 is a circuit diagram illustrating a semiconductor device according to the third embodiment. The semiconductor device according to the third embodiment includes a controller 2, an exclusive-OR circuit XOR1, clock control circuits 3 and 4, and flip-flops RFF1 and RFF2 having a retention function. The controller 2 receives a clock signal from an oscillating circuit 1 such as a PLL, generates a clock signal CLKIN based on the clock signal, and outputs the generated clock signal CLKIN to the exclusive-OR circuit XOR1. Further, the controller 2 also supplies a clock stop signal CLK_STOP to the clock control circuits 3 and 4, and a data retention signal (RET signal) to the flip-flops RFF1 and RFF2.

The XOR1 receives the clock signal CLKIN and an SEL signal, and outputs a result of an exclusive OR operation between the clock signal CLKIN and the SEL signal. When the SEL signal is at a low level, the XOR1 directly outputs the received clock signal CLKIN. Meanwhile, when the SEL signal is at a high level, the XOR1 outputs an inverted signal of the received clock signal CLKIN. Thus, the semiconductor device according to the third embodiment enables switching between non-inversion and inversion of the clock signal CLKIN by switching the SEL signal.

The clock control circuit 4 includes a reset flip-flop FF4 and an AND circuit AND2. The reset flip-flop FF4 receives a clock signal CLK output from the XOR1, and outputs a logical level "1" (high level) at a positive edge of the clock signal CLK. Upon receiving the clock stop signal CLK_STOP from the controller 2, the reset flip-flop FF4 outputs a low-level signal to the AND2. Further, the AND2 receives the output of the reset flip-flop FF4 and the clock signal CLK output from the XOR1, and outputs a result of a logical AND operation between the output of the reset flip-flop FF4 and the clock signal CLK. That is, the clock control circuit 4 outputs a signal in synchronization with the clock signal CLK upon not receiving the clock stop signal CLK_STOP, and outputs a low-level signal upon receiving the clock stop signal CLK_STOP.

The clock control circuit 3 includes a set flip-flop FF3 and an OR circuit OR2. The set flip-flop FF3 receives the clock signal CLK output from the XOR1, and outputs a logical level "0" (low level) at a positive edge of the clock signal CLK. Upon receiving the clock stop signal CLK_STOP from the controller 2, the set flip-flop FF3 outputs a high-level signal to the OR2. The OR2 receives the output of the set flip-flop FF3 and the clock signal CLK output from the XOR1, and outputs a result of a logical OR operation between the output of the set flip-flop FF3 and the clock signal CLK. That is, the clock control circuit 3 outputs a signal in synchronization with the clock signal CLK upon not receiving the clock stop signal CLK_STOP, and outputs a high-level signal upon receiving the clock stop signal CLK_STOP.

The flip-flop RFF1 receives an output (RFF1_CLK_IN) of the AND2 of the clock control circuit 4, and is driven by a positive edge of the signal. In this case, the flip-flop RFF1 is a flip-flop capable of retaining data when the output (RFF1_CLK_IN) of the AND2 of the clock control circuit 4 is at the low level. As the flip-flop RFF1, the master-slave flip-flop shown in FIG. 16A can be used, for example. The flip-flop shown in FIG. 16A includes an AND circuit which receives the clock signal at one input and the data retention signal (RET signal) at the other input, and which outputs a result of a logical AND operation between the clock signal and the RET signal. The signal output as the AND operation result of the AND circuit serves as a clock signal for driving the flip-flop. Further, the RET signal supplied to the flip-flop RFF1 is output from the controller 2.

The flip-flop RFF2 receives an output (RFF2_CLK_IN) of the OR2 of the clock control circuit 3, and is driven by a negative edge of the signal. In this case, the flip-flop RFF2 is a flip-flop capable of retaining data when the output (RFF2_CLK_IN) of the OR2 of the clock control circuit 3 is at the high level. As the flip-flop RFF2, the master-slave flip-flop shown in FIG. 16B can be used, for example. The flip-flop shown in FIG. 16B includes an OR circuit which receives the clock signal at one input and the data retention signal (RET signal) at the other input, and which outputs a result of a logical OR operation between the clock signal and the RET signal. The signal output as the OR operation result of the OR circuit serves as a clock signal for driving the flip-flop. Further, the RET signal supplied to the flip-flop RFF2 is output from the controller 2.

Figure 8:
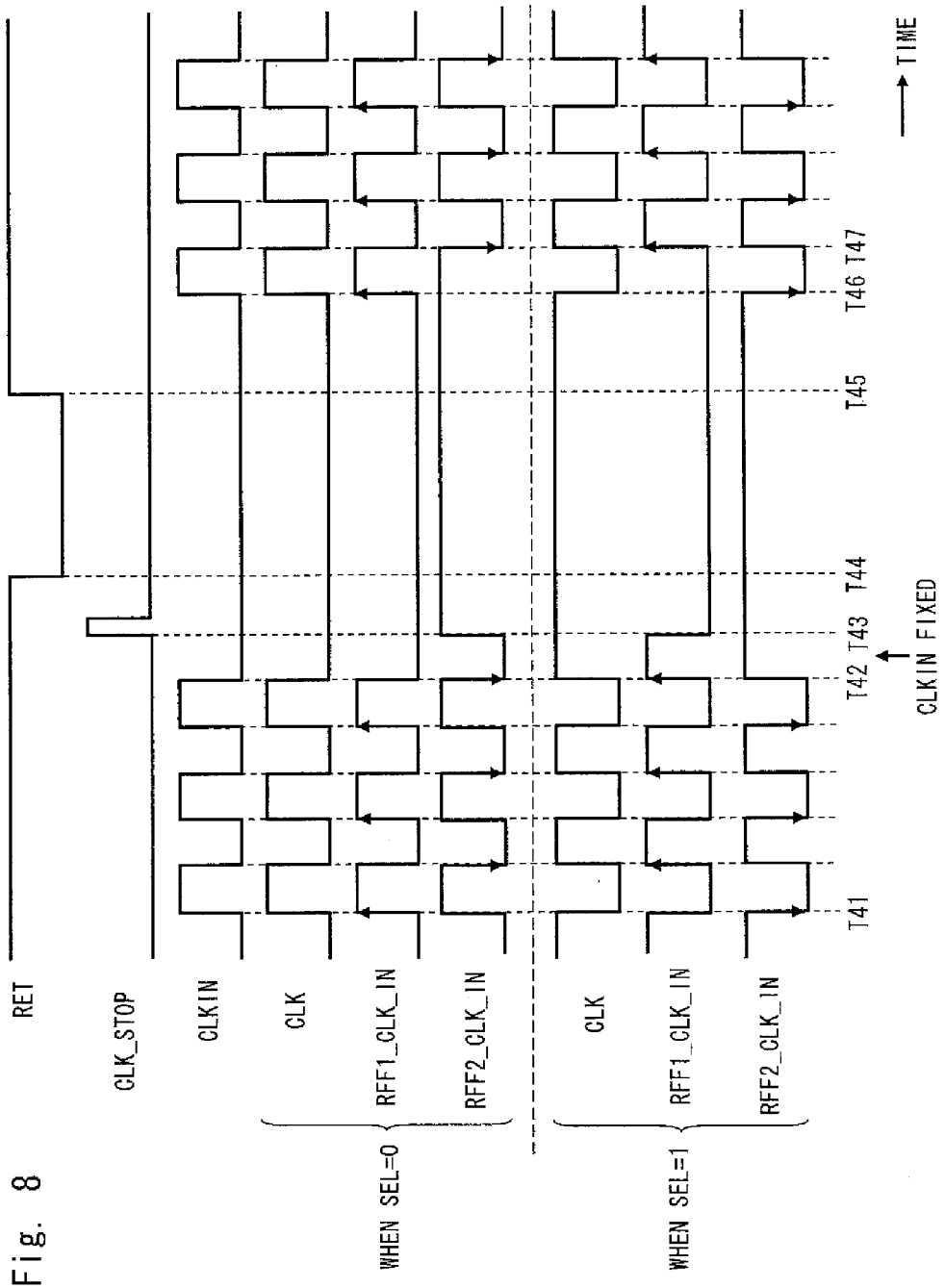
FIG. 8 is a timing diagram illustrating operation of the semiconductor device according to the third embodiment.

Next, operation of the semiconductor device according to the third embodiment will be described. FIG. 8 is a timing diagram illustrating the operation of the semiconductor device according to the third embodiment. As shown in FIG. 8, in the semiconductor device according to the third embodiment, during a period between a timing T42 and a timing T46, the clock signal CLKIN is fixed at the low level. During a period between a timing T44 and a timing T45, the RET signal becomes low level. At a timing T43, the clock stop signal CLK_STOP is supplied in a pulse-like manner to the reset flip-flop FF4 of the clock control circuit 4 and the set flip-flop FF3 of the clock control circuit 3.

First, the case where the SEL signal is at the low level will be described. When the SEL signal is at the low level, the output (CLK) of the XOR1 is synchronized with the clock signal CLKIN (i.e., non-inverted).

When the clock stop signal CLK_STOP is at the low level, the reset flip-flop FF4 of the clock control circuit 4 is driven by a positive edge of the output (CLK) of the XOR1, and outputs a high-level signal ("1") to one input of the AND2. Further, the AND2 receives the output of the reset flip-flop FF4 at one input at one input and the output (CLK) of the XOR1 at the other input, and outputs a result (RFF1_CLK_IN) of a logical AND operation between the output of the reset flip-flop FF4 and the output of the XOR1 to the flip-flop RFF1. Accordingly, the output (RFF1_CLK_IN) of the AND2 is synchronized with the output (CLK) of the XOR1.

When the clock signal CLKIN is fixed at the low level at the timing T42, the output (CLK) of the XOR1 is also fixed at the low level, and the output (RFF1_CLK_IN) of the AND2 is also fixed at the low level. During the period between the timing T44 and the timing T45, the RET signal becomes low level and the flip-flop RFF1 retains data. In this case, the flip-flop RFF1 is a flip-flop capable of retaining data when the output (RFF1_CLK_IN) of the AND2 of the clock control circuit 4 is at the low level. Therefore, the flip-flop RFF1 retains accurate values. Note that when the clock stop signal CLK_STOP is supplied in a pulse-like manner to the reset flip-flop FF4 of the clock control circuit 4 at the timing T43, the reset flip-flop FF4 outputs a low-level signal to one input of the AND2. However, since the output (RFF1_CLK_IN) of the AND2 is already fixed at the low level, the output (RFF1_CLK_IN) of the AND2 does not change.

When the clock signal CLKIN resumes operation at the timing T46, the reset flip-flop FF4 outputs a high-level signal to the AND2 at the timing T46, or at a positive edge of the output (CLK) of the XOR1. Accordingly, the output (RFF1_CLK_IN) of the AND2 is synchronized with the output (CLK) of the XOR1.

Next, the operation of the clock control circuit 3 and the flip-flop RFF2 will be described. When the clock stop signal CLK_STOP is at the low level, the set flip-flop FF3 of the clock control circuit 3 is driven by a positive edge of the output (CLK) of the XOR1, and outputs a low-level signal ("0") to one input of the OR2. Further, the OR2 receives the output of the set flip-flop FF3 at one input and the output (CLK) of the XOR1 at the other input, and outputs a result (RFF2_CLK_IN) of a logical OR operation between the output of the set flip-flop FF3 and the output of the XOR1 to the flip-flop RFF2. Accordingly, the output (RFF2_CLK_IN) of the OR2 is synchronized with the output (CLK) of the XOR1.

When the clock signal CLKIN is fixed at the low level at the timing T42, the output (CLK) of the XOR1 is fixed at the low level, and the output (RFF2_CLK_IN) of the OR2 is also fixed at the low level. Then, at the timing T43, when the clock stop signal CLK_STOP is supplied in a pulse-like manner to the set flip-flop FF3 of the clock control circuit 3, the set flip-flop FF3 outputs a high-level signal to one input of the OR2. As a result, the output (RFF2_CLK_IN) of the OR2 becomes high level. Further, during the period between the timing T44 and the timing T45, the RET signal becomes low level and the flip-flop RFF2 retains data. In this case, the flip-flop RFF2 is a flip-flop capable of retaining data when the output (RFF2_CLK_IN) of the OR2 of the clock control circuit 3 is at the high level. Therefore, the flip-flop RFF2 retains accurate values.

When the clock signal CLKIN resumes operation at the timing T46, the set flip-flop FF3 outputs a low-level signal to the OR2 at the timing T46, or at a positive edge of the output (CLK) of the XOR1. Accordingly, the output (RFF2_CLK_IN) of the OR2 is synchronized with the output (CLK) of the XOR1.

Next, the case where the SEL signal is at the high level will be described. When the SEL signal is at the high level, the output (CLK) of the XOR1 is an inverted signal of the clock signal CLKIN.

When the clock stop signal CLK_STOP is at the low level, the reset flip-flop FF4 of the clock control circuit 4 is driven by a positive edge of the output (CLK) of the XOR1, and outputs a high-level signal ("1") to one input of the AND2. Further, the AND2 receives the output of the reset flip-flop FF4 at one input and the output (CLK) of the XOR1 at the other input, and outputs a result (RFF1_CLK_IN) of a logical AND operation between the output of the reset flip-flop FF4 and the output of the XOR1 to the flip-flop RFF1. Accordingly, the output (RFF1_CLK_IN) of the AND2 is synchronized with the output (CLK) of the XOR1.

When the clock signal CLKIN is fixed at the low level at the timing T42, the output (CLK) of the XOR1 is fixed at the high level, and the output (RFF1_CLK_IN) of the AND2 is also fixed at the high level. Then, at the timing T43, when the clock stop signal CLK_STOP is supplied in a pulse-like manner to the reset flip-flop FF4 of the clock control circuit 4, the reset flip-flop FF4 outputs a low-level signal to one input of the AND2. As a result, the output (RFF1_CLK_IN) of the AND2 becomes low level. Further, during the period between the timing T44 and the timing T45, the RET signal becomes low level, and the flip-flop RFF1 retains data. In this case, the flip-flop RFF1 is a flip-flop capable of retaining data when the output (RFF1_CLK_IN) of the AND2 of the clock control circuit 4 is at the low level. Therefore, the flip-flop RFF1 retains accurate values.

When the clock signal CLKIN resumes operation at the timing T46, the reset flip-flop FF4 outputs a high-level signal to the AND2 at a timing T47, or at a positive edge of the output (CLK) of the XOR1. Accordingly, the output (RFF1_CLK_IN) of the AND2 is synchronized with the output (CLK) of the XOR1.

Next, the operation of the clock control circuit 3 and the flip-flop RFF2 will be described. When the clock stop signal CLK_STOP is at the low level, the set flip-flop FF3 of the clock control circuit 3 is driven by a positive edge of the output (CLK) of the XOR1, and outputs a low-level signal ("0") to one input of the OR2. Further, the OR2 receives the output of the set flip-flop FF3 at one input and the output (CLK) of the XOR1 at the other input, and outputs a result (RFF2_CLK_IN) of a logical OR operation between the output of the set flip-flop FF3 and the output of the XOR1 to the flip-flop RFF2. Accordingly, the output (RFF2_CLK_IN) of the OR2 is synchronized with the output (CLK) of the XOR1.

When the clock signal CLKIN is fixed at the low level at the timing T42, the output (CLK) of the XOR1 is fixed at the high level, and the output (RFF2_CLK_IN) of the OR2 is also fixed at the high level. Further, during the period between the timing T44 and the timing T45, the RET signal becomes low level and the flip-flop RFF2 retains data. In this case, the flip-flop RFF2 is a flip-flop capable of retaining data when the output (RFF2_CLK_IN) of the OR2 of the clock control circuit 3 is at the high level. Therefore, the flip-flop RFF2 retains accurate values. When the clock stop signal CLK_STOP is supplied in a pulse-like manner to the set flip-flop FF3 of the clock control circuit 3 at the timing T43, the set flip-flop FF3 outputs a high-level signal to one input of the OR2. However, since the output (RFF1_CLK_IN) of the OR2 is already fixed at the high level, the output (RFF2_CLK_IN) of the OR2 does not change.

When the clock signal CLKIN resumes operation at the timing T46, the set flip-flop FF3 outputs a low-level signal to the OR2 at the timing T46, or at a positive edge of the output (CLK) of the XOR1. Accordingly, the output (RFF2_CLK_IN) of the OR2 is synchronized with the output (CLK) of the XOR1.

In the semiconductor device according to the third embodiment, even in the case where the signal (RFF1_CLK_IN) input to the flip-flop RFF1 capable of retaining data at the time of low level is fixed at the high level when the clock signal CLKIN is fixed, the signal (RFF1_CLK_IN) can be forcibly set to the low level by using the clock control circuit 4. This configuration enables the flip-flop RFF1 to retain accurate data.

Furthermore, in the semiconductor device according to the third embodiment, even in the case where the signal (RFF2_CLK_IN) input to the flip-flop RFF2 capable of retaining data at the time of high level is fixed at the low level when the clock signal CLKIN is fixed, the signal (RFF2_CLK_IN) can be forcibly set to the high level by using the clock control circuit 3. This configuration enables the flip-flop RFF2 to retain accurate data.

Consequently, the semiconductor device according to the third embodiment can prevent the occurrence of unintended latching of data when the flip-flop having a retention function retains data.

The semiconductor devices described in the first to third embodiments may also be expressed as follows. That is, each of the semiconductor devices described in the first to third embodiments includes: the flip-flops RFF1 and RFF2 which are driven in synchronization with the clock signal (RFF1_CLK_IN, RFF2_CLK_IN) and retain data according to the data retention signal (RET signal); the clock control circuits 3 and 4 which control the clock signals supplied to the flip-flops RFF1 and RFF2; and the controller 2 which supplies the input clock signal CLKIN (CLK in the third embodiment) to the clock control circuits 3 and 4, supplies the data retention signal (RET signal) to the flip-flops RFF1 and RFF2, and controls the clock control circuits 3 and 4.

When the flip-flop RFF1 is driven by a positive edge of the clock signal (RFF1_CLK_IN) and retains data when the clock signal (RFF1_CLK_IN) is at the low level, the controller 2 controls the clock control circuit so that the low-level clock signal (RFF1_CLK_IN) is supplied to the flip-flop RFF1 after the input clock signal (CLKIN, CLK) is fixed and before the flip-flop RFF1 retains data (second and third embodiments).

Meanwhile, when the flip-flop RFF2 is driven by a negative edge of the clock signal (RFF2_CLK_IN) and retains data when the clock signal (RFF2_CLK_IN) is at the high level, the controller 2 controls the clock control circuit 4 so that the high-level clock signal (RFF2_CLK_IN) is supplied to the flip-flop RFF2 after the input clock signal (CLKIN, CLK) is fixed and before the flip-flop RFF2 retains data (first and third embodiments).

The present invention can also be applied to a program for causing a computer to execute processing for inserting a clock control circuit into a circuit. In this case, the program according to the present invention is a program for causing a computer to execute processing for inserting a clock control circuit into a circuit, the processing including inserting the clock control circuit 4, which supplies a low-level clock signal to the flip-flop RFF1 after the clock signal is fixed and before the flip-flop retains data, at a preceding stage of the flip-flop RFF1, which is driven by a positive edge of the clock signal and retains data when the clock signal is at the low level, out of the flip-flops RFF1 and RFF2, which are driven in synchronization with the clock signal (RFF1_CLK_IN, RFF2_CLK_IN) and retain data according to the data retention signal (RET signal).

The processing further includes inserting the clock control circuit 3, which supplies a high-level clock signal to the flip-flop RFF2 after the clock signal is fixed and before the flip-flop retains data, at a preceding stage of the flip-flop RFF2, which is driven by a negative edge of the clock signal and retains data when the clock signal is at the high level, out of the flip-flops RFF1 and RFF2.

Fourth Embodiment

Next, a fourth embodiment of the present invention will be described. In the fourth embodiment, the clock control circuits 3 and 4 of the semiconductor devices described in the first to third embodiments are configured without the set flip-flop FF3 and the reset flip-flop FF4. The other components are similar to those of the semiconductor devices described in the first to third embodiments, so a redundant description thereof is omitted.

Figure 9A:
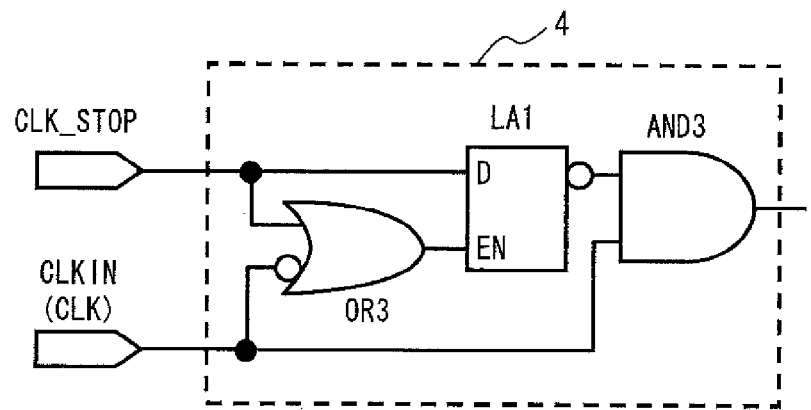
FIGS. 9A and 9B are circuit diagrams each illustrating a semiconductor device according to a fourth embodiment of the present invention.

Referring to FIG. 9A, in the clock control circuit 4 of a semiconductor device according to the fourth embodiment, the clock control circuit 4 has a configuration including an OR circuit OR3 (a third OR circuit), a latch LA1 (a first latch circuit), and an AND circuit AND3 (a third AND circuit). As shown in FIG. 9A, the OR3 constituting the clock control circuit 4 receives the clock stop signal CLK_STOP at one input and an inverted signal of the clock signal CLKIN at the other input, and outputs a result of a logical OR operation between the clock stop signal CLK_STOP and the inverted signal of the clock signal CLKIN to an enable input (EN) of the latch LA1. The latch LA1 receives the clock stop signal CLK_STOP, and outputs an inverted signal of the clock stop signal CLK_STOP according to the output of the OR3. The latch LA1 is a gated D-latch circuit, for example. The AND3 receives the output of the latch LA1 at one input and the clock signal CLKIN at the other input, and outputs a result of a logical AND operation between the output of the latch LA1 and the clock signal CLKIN.

In the circuit shown in FIG. 9A, when the clock stop signal CLK_STOP is at a low level, the latch LA1 always outputs a high-level signal to one input of the AND3. Accordingly, the AND3 outputs a signal in synchronization with the lock signal CLKIN. Meanwhile, when the clock stop signal CLK_STOP becomes high level, the AND3 always outputs a low-level signal, because the latch LA1 always outputs a low-level signal to one input of the AND3.

Figure 9B:
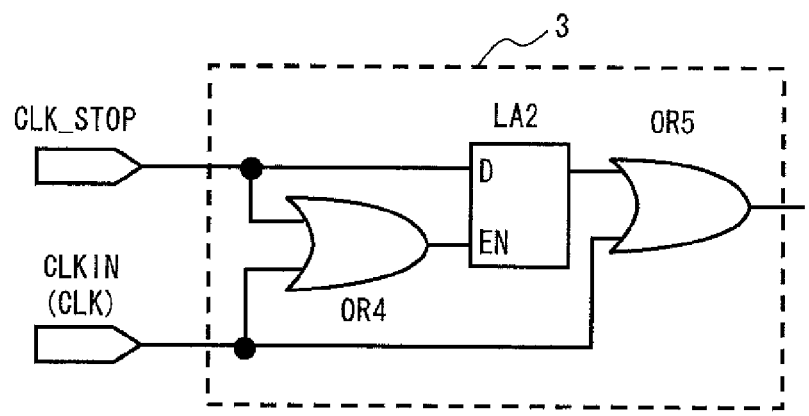

Referring now to FIG. 9B, the clock control circuit 3 of the semiconductor device according to the fourth embodiment is composed of a circuit including an OR circuit OR4 (a fourth OR circuit), a latch LA2 (a second latch circuit), and an OR circuit OR5 (a fifth OR circuit). As shown in FIG. 9B, the OR4 constituting the clock control circuit 3 receives the clock stop signal CLK_STOP at one input and the clock signal CLKIN at the other input, and outputs a result of a logical OR operation between the clock stop signal CLK_STOP and the clock signal CLKIN to an enable input (EN) of the latch LA2. The latch LA2 receives the clock stop signal CLK_STOP, and outputs the signal according to the output of the OR3. The latch LA2 is a gated D-latch circuit, for example. The OR5 receives the output of the latch LA2 at one input and the clock signal CLKIN at the other input, and outputs a result of a logical OR operation between the output of the latch LA2 and the clock signal CLKIN.

In the circuit shown in FIG. 9B, when the clock stop signal CLK_STOP is at the low level, the latch LA2 always outputs a low-level signal to one input of the OR5. Accordingly, the OR5 always outputs a signal in synchronization with the clock signal CLKIN. Meanwhile, when the clock stop signal CLK_STOP becomes high level, the latch LA2 always outputs a high-level signal to one input of the OR5. Accordingly, the OR5 always outputs a high-level signal.

In the semiconductor device according to the fourth embodiment, the clock control circuits 3 and 4 of the semiconductor devices described in the first to third embodiments have circuit configurations using latch circuits as shown in FIGS. 9A and 9B. This enables reduction in circuit area compared to that of the first to third embodiments. Also when the semiconductor device according to the fourth embodiment is employed, the same effects as those of the first to third embodiments can be obtained.

Fifth Embodiment

Next, a fifth embodiment of the present invention will be described. In the fifth embodiment, the clock control circuit 4 and the clock gating circuit 5 of the semiconductor devices described in the first to third embodiments are combined into one circuit, and the clock control circuit 3 and the clock gating circuit 6 of the semiconductor devices described in the first to third embodiments are also combined into one circuit. The other components are similar to those of the semiconductor devices according to the first to third embodiments, so a redundant description thereof is omitted.

Figures 10, 11:
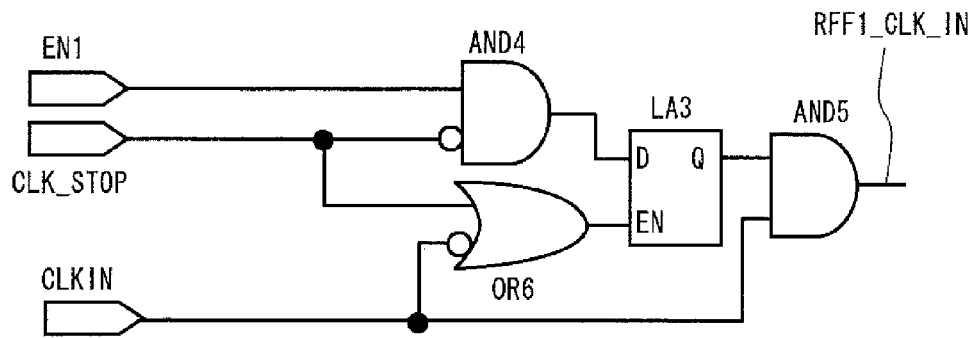
FIG. 10 is a circuit diagram illustrating a semiconductor device according to a fifth embodiment of the present invention.
FIG. 11 is a truth table illustrating operation of the semiconductor device according to the fifth embodiment.

FIG. 10 is a circuit diagram showing the case where the clock control circuit 4 and the clock gating circuit 5 of the semiconductor devices described in the first to third embodiments are combined into one circuit (hereinafter referred to as "first clock processing circuit"). The first clock processing circuit according to the fifth embodiment shown in FIG. 10 includes AND circuits AND4 (a fourth AND circuit) and AND5 (a fifth AND circuit), an OR circuit OR6 (a sixth OR circuit), and a latch LA3 (a third latch circuit). The AND4 receives the enable signal EN1 at one input and an inverted signal of the clock stop signal CLK_STOP at the other input, and outputs a result of a logical AND operation between the enable signal EN1 and the inverted signal of the clock stop signal CLK_STOP to one input of the latch LA3. The OR6 receives the clock stop signal CLK_STOP at one input and an inverted signal of the clock signal CLKIN at the other input, and outputs a result of a logical OR operation between the clock stop signal CLK_STOP and the inverted signal of the clock signal CLKIN to an enable input (EN) of the latch LA3. The latch LA3 receives the output of the AND4, and outputs the signal according to the output of the OR6. The latch LA3 is a gated D-latch circuit, for example. The AND5 receives the output of the latch LA3 at one input and the clock signal CLKIN at the other input, and outputs a result of a logical AND operation between the output of the latch LA3 and the clock signal CLKIN.

FIG. 11 is a truth table of the first clock processing circuit shown in FIG. 10. As shown in FIG. 11, when the clock stop signal CLK_STOP indicates "0" and the enable signal EN1 indicates "0", the output (RFF1_CLK_IN) of the AND5 is always "0". When the clock stop signal CLK_STOP indicates "0" and the enable signal EN1 indicates "1", the output (RFF1_CLK_IN) of the AND5 is synchronized with the clock signal CLKIN. Meanwhile, when the clock stop signal CLK_STOP indicates "1", the output (RFF1_CLK_IN) of the AND5 is "0" regardless of the values of the clock signal CLKIN and the enable signal EN1.

Figures 12, 13:
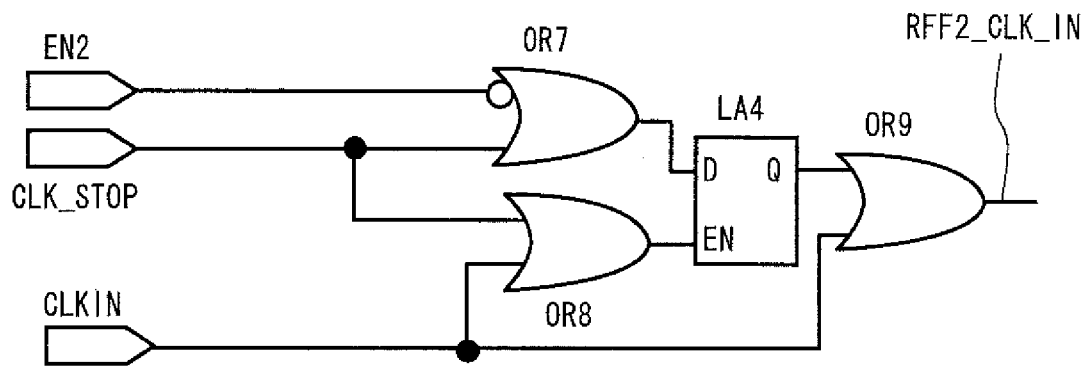
FIG. 12 is a circuit diagram illustrating the semiconductor device according to the fifth embodiment.
FIG. 13 is a truth table illustrating operation of the semiconductor device according to the fifth embodiment.

FIG. 12 is a circuit diagram showing the case where the clock control circuit 3 and the clock gating circuit 6 of the semiconductor devices described in the first to third embodiments are combined into one circuit (hereinafter referred to as "second clock processing circuit). The second clock processing circuit according to the fifth embodiment shown in FIG. 12 includes OR circuits OR7 (a seventh OR circuit), OR8 (an eighth OR circuit), and OR9 (a ninth OR circuit) and a latch LA4 (a fourth latch circuit). The OR7 receives an inverted signal of the enable signal EN2 at one input and the clock stop signal CLK_STOP at the other input, and outputs a result of a logical OR operation between the inverted signal of the enable signal EN2 and the clock stop signal CLK_STOP to one input of the latch LA4. The OR8 receives the clock stop signal CLK_STOP at one input and the clock signal CLKIN at the other input, and outputs a result of a logical OR operation between the clock stop signal CLK_STOP and the clock signal CLKIN to an enable input (EN) of the latch LA4. The latch LA4 receives the output of the OR7, and outputs the signal according to the output of the OR8. The latch LA4 is a gated D-latch circuit, for example. The OR9 receives the output of the latch LA4 at one input and the clock signal CLKIN at the other input, and outputs a result of a logical OR operation between the output of the latch LA4 and the clock signal CLKIN.

FIG. 13 is a truth table of the second clock processing circuit shown in FIG. 12. As shown in FIG. 13, when the clock stop signal CLK_STOP indicates "0" and the enable signal EN2 indicates "0", the output (RFF2_CLK_IN) of the OR9 is always "1". When the clock stop signal CLK_STOP indicates "0" and the enable signal EN2 indicates "1", the output (RFF2_CLK_IN) of the OR9 is synchronized with the clock signal CLKIN. Meanwhile, when the clock stop signal CLK_STOP indicates "1", the output (RFF2_CLK_IN) of the OR9 is "0" regardless of the values of the clock signal CLKIN and the enable signal EN2.

In the semiconductor device according to the fifth embodiment, the clock control circuit 4 and the clock gating circuit 5 of the semiconductor devices described in the first to third embodiments are combined into one circuit, and the clock control circuit 3 and the clock gating circuit 6 of the semiconductor devices described in the first to third embodiments are also combined into one circuit. This enables reduction in circuit area compared to that of the first to third embodiments. Also when the semiconductor device according to the fifth embodiment is employed, the same effects as those of the first to third embodiments can be obtained.

Sixth Embodiment

Next, a sixth embodiment of the present invention will be described. In a semiconductor device according to the sixth embodiment, flip-flops capable of retaining data at both the low level and the high level of an operation clock are used as part of the flip-flops which constitute the semiconductor device and have a retention function. The other components are similar to those of the first to fifth embodiments, so a redundant description thereof is omitted.

Figure 14:
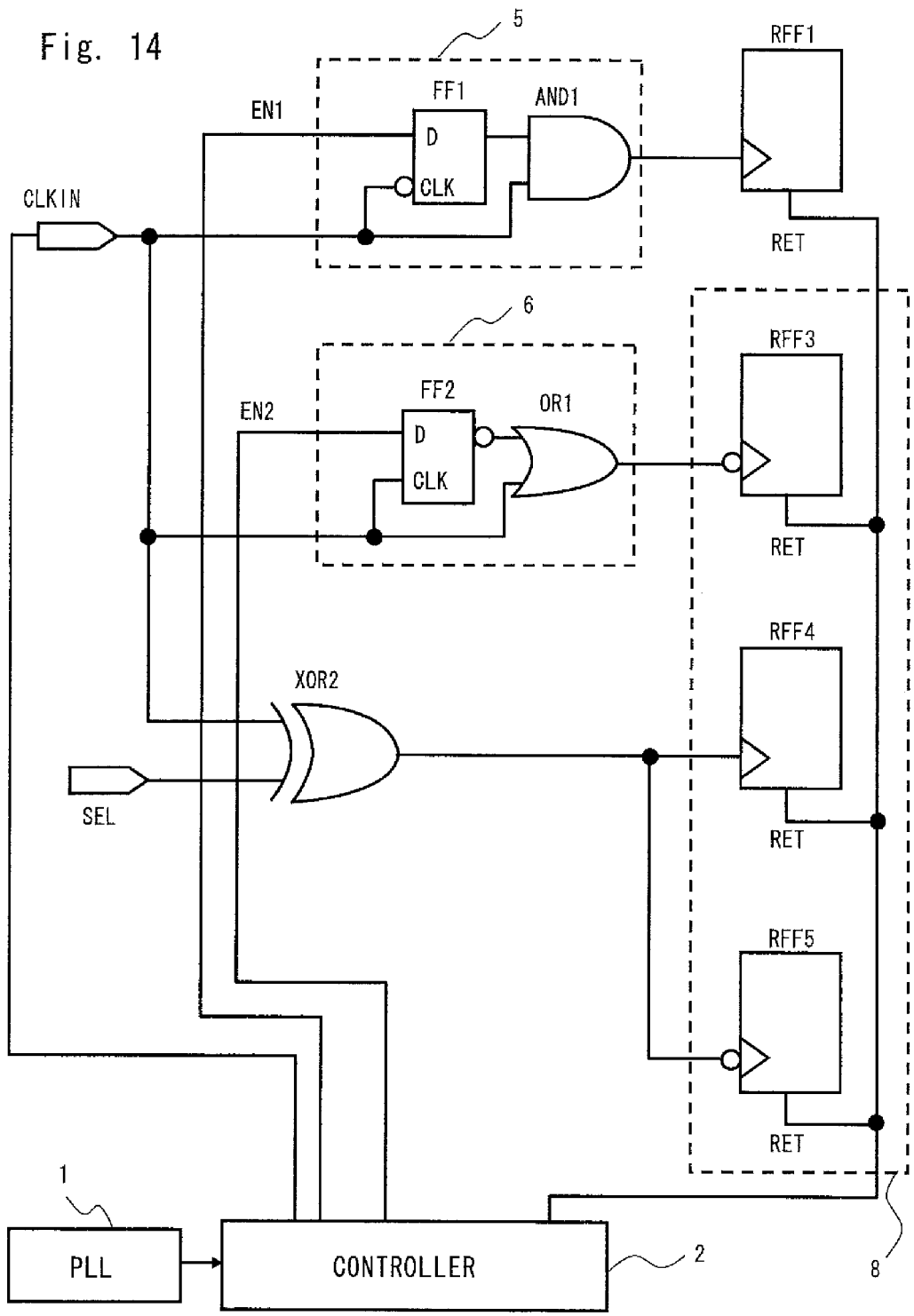
FIG. 14 is a circuit diagram illustrating a semiconductor device according to a sixth embodiment of the present invention.

FIG. 14 is a circuit diagram illustrating the semiconductor device according to the sixth embodiment. The semiconductor device according to the sixth embodiment shown in FIG. 14 includes a controller 2, an exclusive-OR circuit XOR2, clock gating circuits 5 and 6, and flip-flops RFF1 and RFF3 to RFF5 having a retention function. The controller 2 receives a clock signal from an oscillating circuit 1 such as a PLL, generates a clock signal CLKIN based on the clock signal, and outputs the generated clock signal CLKIN to each of the clock gating circuit 5, the clock gating circuit 6, and the exclusive-OR circuit XOR2. The controller 2 also supplies enable signals EN1 and EN2 to the clock gating circuits 5 and 6, respectively. The controller 2 also supplies a data retention signal (RET signal) to each of the flip-flops RFF1 and RFF3 to RFF5. The clock gating circuits 5 and 6 are similar to the clock gating circuit described in the first embodiment.

In the semiconductor device according to the sixth embodiment, the flip-flop RFF1 is driven by a positive edge of a non-inverted clock signal, and the flip-flop RFF3 is driven by a negative edge of a non-inverted clock signal. The XOR2 circuit supplies an inverted clock signal, which is obtained by inverting the clock signal CLKIN, to the flip-flops RFF4 and RFF5 (i.e., the SEL signal is set to a high level). Accordingly, the flip-flop RFF4 is driven by a positive edge of an inverted clock signal, and the flip-flop RFF3 is driven by a negative edge of the non-inverted clock signal.

In the semiconductor device according to the sixth embodiment, a flip-flop capable of retaining data when a drive clock is at a low level is used as the flip-flop RFF1 having a retention function. As the flip-flops RFF3 to RFF5 having a retention function, flip-flops (balloon flip-flops) capable of retaining data at both the low level and the high level of the drive clock are used. As the flip-flops capable of retaining data at both the low level and the high level of the drive clock, the D flip-flop circuit disclosed in Japanese Unexamined Patent Application Publication No. 08-191234 may be used, for example.

In the semiconductor device according to the sixth embodiment, flip-flops capable of retaining data at both the low level and the high level of the drive clock are used in a portion (a flip-flop circuit group 8) in which unintended latching of data may occur when flip-flops capable of retaining data at either the low level or the high level are used. This prevents the occurrence of unintended latching of data when the flip-flops having a retention function retain data.

In general, flip-flops capable of retaining data at both the low level and the high level of the drive clock have a large cell area. However, as in the semiconductor device according to the sixth embodiment, when such flip-flop circuits are provided in only the portion (the flip-flop circuit group 8), in which unintended latching of data may occur, the circuit area can be reduced and the power consumption can also be reduced.

Though the embodiments of the present invention have been described above, the present invention is not limited to the configurations of the embodiments. The embodiments can be modified, altered, or combined in various manners which can be understood by those skilled in the art within the scope of the claims of the present invention.

The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

The first to sixth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor integrated circuit comprising:
a first retention flip-flop configured in a first type in which a retention flip-flop is able to retain data based on one of a low-level clock signal and a high-level clock signal, and unable to retain data based on another one of the low-level clock signal and high-level clock signal;
a second retention flip-flop configured in a second type in which a retention flip-flop is able to retain data based on the low-level clock signal and also able to retain data based on the high-level clock signal,
a third retention flip-flop configured in the second type;
a fourth retention flip-flop configured in the second type; and
an XOR gate coupled to the third and fourth retention flip-flops to output a clock signal thereto.

2. The semiconductor integrated circuit according to claim 1, further comprising:
an AND gate coupled to the first retention flip-flop to output a clock signal thereto;
a first flip-flop coupled to the AND gate;
an OR gate coupled to the second retention flip-flop to output a clock signal thereto; and
a second flip-flop coupled to the OR gate.

3. The semiconductor integrated circuit according to claim 2, further comprising:
a control logic coupled to the first and second flip-flops to output an enable signal and a clock signal thereto.

4. The semiconductor integrated circuit according to claim 3, wherein the control logic further outputs a retention signal to the first, second, third, and fourth retention flip-flops.

5. The semiconductor integrated circuit according to claim 4, further comprising:
a first inverting logic coupled between the OR gate and the second retention flip-flop;
a second inverting logic coupled between the XOR gate and the fourth retention flip-flop;
a third inverting logic coupled between the control logic and the first flip-flop; and
a fourth inverting logic coupled between the second flip-flop and the OR gate.

* * * * *